US007844357B2

(12) United States Patent
Sakano

(10) Patent No.: US 7,844,357 B2
(45) Date of Patent: Nov. 30, 2010

(54) CONTROLLING DEVICE FOR SUBSTRATE PROCESSING APPARATUS AND METHOD THEREFOR

(75) Inventor: Shinji Sakano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 195 days.

(21) Appl. No.: 11/874,626

(22) Filed: Oct. 18, 2007

(65) Prior Publication Data

US 2009/0132078 A1 May 21, 2009

Related U.S. Application Data

(60) Provisional application No. 60/883,866, filed on Jan. 8, 2007.

(30) Foreign Application Priority Data

Oct. 20, 2006 (JP) ............................. 2006-286676

(51) Int. Cl.
*G06F 19/00* (2006.01)
(52) U.S. Cl. ...................... 700/103; 700/108
(58) Field of Classification Search ................ 700/103, 700/108
See application file for complete search history.

(56) References Cited

U.S. PATENT DOCUMENTS

| 6,625,497 | B2 * | 9/2003 | Fairbairn et al. ............... 700/1 |
| 7,047,095 | B2 | 5/2006 | Tomoyasu |
| 7,158,851 | B2 * | 1/2007 | Funk .......................... 700/121 |
| 2002/0155629 | A1 * | 10/2002 | Fairbairn et al. .............. 438/14 |
| 2003/0015699 | A1 * | 1/2003 | Su ............................... 257/48 |
| 2003/0045961 | A1 | 3/2003 | Nakao |
| 2003/0165755 | A1 | 9/2003 | Mui et al. |
| 2004/0267399 | A1 * | 12/2004 | Funk .......................... 700/121 |
| 2005/0198609 | A1 * | 9/2005 | Hwang et al. ................. 716/21 |
| 2006/0048697 | A1 * | 3/2006 | Houge et al. .................. 117/11 |
| 2006/0200265 | A1 | 9/2006 | Hsu et al. |

FOREIGN PATENT DOCUMENTS

| JP | 2004-207703 | 7/2004 |
| KR | 2003-0019256 | 3/2003 |

* cited by examiner

*Primary Examiner*—Albert DeCady
*Assistant Examiner*—Sivalingam Sivanesan
(74) *Attorney, Agent, or Firm*—Oblon, Spivak, McClelland, Maier & Neustadt, L.L.P.

(57) ABSTRACT

A target value that serves as a control value with feed forward control is optimized. A TL performs a feed forward and a feedback control of a PM. A storage unit stores a plurality of recipes indicating different processing sequences, and a target value that serves as a control value when performing an etching process. A communication unit causes an IMM to measure a processing state of the wafer and receives measurement information. A computation unit computes a feedback value for the current wafer processed in the current cycle, based on pre-processing and post-processing measurement information for the wafer. An update unit updates the target value using the feedback value. A recipe adjustment unit changes the recipe to change the process performed in the same PM. When the process is performed after changing, the updated target value is used to perform feed forward control of the wafer in the same PM.

26 Claims, 22 Drawing Sheets

FIG.7

| PROCESS RECIPE A | | | |
|---|---|---|---|
| STAGE HEATER SET TEMPERATURE 640°C (FIXED) | | | |
| STEP ITEMS | STEP 1 | STEP 2 | STEP 3 |
| TIME (s) | 10 | 5 | 5 |
| PRESSURE (Torr) | 2 | 5 | 0 |
| TiCl₄ FLOW VOLUME (sccm) | 0 | 20 | 0 |
| ClF₃ FLOW VOLUME (sccm) | 0 | 0 | 0 |
| Ar FLOW VOLUME (sccm) | 0 | 0 | 1000 |
| H₂ FLOW VOLUME (sccm) | 20 | 20 | 0 |
| NH₃ FLOW VOLUME (sccm) | 0 | 0 | 0 |
| N₂ FLOW VOLUME (sccm) | 0 | 0 | 0 |
| TiCl₄ FLOW MODE | Auto Flow | Auto Flow | Auto Flow |
| ClF₃ FLOW MODE | Auto Flow | Auto Flow | Auto Flow |
| Ar FLOW MODE | Auto Flow | Auto Flow | Auto Flow |
| RF OUTPUT (W) | | | |

CONTROLLING DEVICE FOR SUBSTRATE PROCESSING APPARATUS AND METHOD THEREFOR

CROSS REFERENCE TO RELATED APPLICATIONS

The present invention contains subject matter related to Japanese Patent Application No. 2006-286676 filed in the Japan Patent Office on Oct. 20, 2006 and Provisional Application No. 60/883,866 filed on Jan. 8, 2007, the entire contents of which being incorporated herein by reference.

BACKGROUND OF THE INVENTION

1. Field of the Invention

The present invention relates to a controlling device for a substrate processing apparatus that performs a specified process on a substrate, to a control method, and to a storage medium that stores a control program. More particularly, the present invention relates to an optimal adjustment of a feed forward control of the same substrate processing apparatus.

2. Description of the Related Art

When a desired process is performed in succession on a plurality of substrates, a reaction product that is generated during the process gradually adheres to an interior wall of a substrate processing apparatus, thereby gradually changing the atmosphere inside the substrate processing apparatus. A feed forward control and a feedback control have been proposed for some time in order to perform the substrate processing with constantly good precision while adapting to the changing atmosphere (for example, refer to Japanese Patent Application Publication No. JP-A-2004-207703.)

In the feedback control, for example, in a case where an etching process is performed on the substrate, the state of the substrate surface is measured by a measuring instrument before and after the etching process. The measurements of the state of the substrate surface before and after processing are used to determine the extent to which the actual amount of material removed from the substrate deviates from a target value. Based on the amount of the deviation, a feedback value, such as the etching amount per unit time, for example, is computed, and the computed feedback value is used in an updating of the target value. In this manner, the target value is constantly optimized so that it reflects the current changes in the atmosphere inside the substrate processing apparatus.

In the feed forward control, the most recent target value determined by the feedback control is defined as a control value, and the specified processing of the substrate is performed based on the control value. For example, in a case where the target value is the etching amount per unit time, even if the atmosphere in the substrate processing apparatus gradually changes, the substrate is processed well according to the etching amount per unit time, which is varied according to the changes in the atmosphere inside the substrate processing apparatus.

SUMMARY OF THE INVENTION

However, in the known art, the same target value is not commonly used in separate processes performed in the same substrate processing apparatus. For example, even if the process performed in the same substrate processing apparatus is changed from a first process to a second process, the target value that is constantly optimized to reflect the atmosphere changes inside the substrate processing apparatus when the first process is being performed cannot be used when the second process is performed, and thus the feedback control has to be performed using a different target value for the second process.

In addition, recently, in order to handle strong demand for reduced size IC chips and reduction in power consumption, many processes have been proposed that realize even more sophisticated micro-processing. In such processes, it is necessary to perform even more precise control as compared to the processes performed in the known technology. As a result, when a first process is changed to a second process performed in the same substrate processing apparatus as in know art, and it is not possible to commonly use the same target value, regardless of whether the atmosphere inside the apparatus changes from when the first process was performed, the target value of the second process does not change so as to reflect the changes in the atmosphere. Particularly, the processing when the second process is initially performed deteriorates, and as a result the finished product after the substrate process sometimes has less value as a commercial product.

Accordingly, the one embodiment of the present invention provides a controlling device for a substrate processing apparatus. The controlling device optimizes a target value that serves as the control value during feed forward control. The present invention also provides a control method and a storage medium that stores a control program.

Specifically, the one embodiment of the present invention provides a controlling device for a substrate processing apparatus that performs a specified process on a substrate. The controlling device includes: a storage unit that stores a plurality of recipes that respectively indicate different processing sequences, and a specified target value that serves as a control value when the specified process is performed on the substrate; a communication unit that causes a measuring device to measure measurement information including a pre-processing state and a post-processing state of the substrate that is processed by the substrate processing apparatus in accordance with a processing sequence indicated in a first recipe included among the plurality of recipes stored in the storage unit, and receives the measurement information; a computation unit that computes a feedback value that corresponds to a processed state of the substrate processed in the current cycle, based on the pre-processing state and the post-processing state measurement information for the substrate processed in the current cycle within the measurement information received by the communication unit; an update unit that updates the target value stored in the storage unit using the feedback value computed by the computation unit; a recipe adjustment unit that changes the recipe that indicates the processing sequence performed in the substrate processing apparatus from the first recipe to a second recipe, the first recipe and the second recipe is stored in the storage unit; and a process execution control unit that controls a processing of a substrate transferred in the substrate processing apparatus with feed forward control while using the target value updated by the update unit, in accordance with the processing sequence indicated in the second recipe, which was changed to by the recipe adjustment unit.

In this aspect, one example of the specified target value is a parameter that indicates a process condition. The parameter may be a substrate processing time (for example, an amount of etching per unit time), a pressure within the substrate processing apparatus, an electric power that is applied to the substrate processing apparatus, a temperature at a specified position in the substrate processing apparatus (for example, one of an upper electrode, a lower electrode, a stage, and an interior wall of the apparatus), a mixture ratio of a plurality of types of gases that are supplied to the substrate processing apparatus, a gas flow volume that is supplied to the substrate processing apparatus, and the like.

According to this aspect, even if the recipe indicating the processing sequence performed in the same substrate processing apparatus is changed from the first recipe to the second recipe, the constantly updated (by feedback) target value that reflects the atmosphere in the substrate processing apparatus when the first recipe was being performed continues to be used while feed forward control is performed for the substrate in the same substrate processing apparatus in accordance with the processing sequence indicated in the second recipe.

Therefore, even if a different process is performed in the same substrate processing apparatus due to changing the recipe, it is possible to precisely process the substrate transferred in the same substrate processing apparatus from immediately after starting the post-change process, based on the target value that reflects changes in the atmosphere inside the substrate processing apparatus. Particularly, even if a process that requires micro-processing is being performed, it is possible to perform processing of the wafer with good precision without inaccuracy of the processing. Thus, product yield can be improved, whereby it is possible to achieve productivity improvements and production cost reduction.

The storage unit may store a plurality of feed forward plans that respectively indicate a processing sequence for performing feed forward control. Each feed forward plan may contain one of the target value. In addition, the process execution control unit may have the right to access the plurality of feed forward plans stored in the storage unit.

If the above-described configuration is adopted, as a result of the process execution control unit having the right to access the plurality of feed forward plans, it is possible for any of the target values included in the plurality of feed forward plans to be used when different processes are performed. Thus, even if the process performed in the same substrate processing apparatus is changed, a target value that reflects changes in the atmosphere inside the substrate processing apparatus can continue to be used, and the respective target values contained in other feed forward plans can be selectively used.

Even if the recipe adjustment unit changes the recipe that indicates the processing sequence performed in the same substrate processing apparatus from the first recipe to the second recipe, the feed forward plan may be not changed and the same feed forward plan may be selected. In addition, the process execution control unit may continue to use the target value contained in the same feed forward plan that has been selected to perform feed forward control for a substrate transferred in the same substrate processing apparatus.

If the above described configuration is adopted, even if the recipe is changed from the first recipe to the second recipe, the feed forward plan is not changed and the same plan is selected. Accordingly, the target value contained in the same feed forward plan that is selected can continue to be used to perform feed forward control of the substrate that is transferred in the same substrate processing apparatus. As a result, the target value that reflects the atmosphere changes inside of the substrate processing apparatus continues to be used, thereby making it possible to precisely process the substrate transferred in the same substrate processing apparatus from immediately after starting the post-change process.

A configuration may be adopted in which the storage unit stores a plurality of target values, and the process execution control unit has the right to access the plurality of the target values stored in the storage unit.

If the above-described configuration is adopted, the process execution control unit has the right to access the plurality of the target values. More specifically, the process execution control unit can use any of the plurality of target values when performing a plurality of types of process. Therefore, even if the process performed in the same substrate processing apparatus is changed, the target value that reflects the atmosphere changes inside of the substrate processing apparatus can continued to be used, and other target values can be selected and used.

A configuration may be adopted in which, even if the recipe adjustment unit changes the recipe that indicates the processing sequence performed in the same substrate processing apparatus from the first recipe to the second recipe, the target value may be not changed and the same target value may be selected. Further, the process execution control unit may continue to use the same target value that has been selected to perform feed forward control for a substrate transferred in the same substrate processing apparatus.

If the above described configuration is adopted, even if the recipe is changed from the first recipe to the second recipe, the target value is not changed and the same target value is selected. Accordingly, the same target value that is selected can continue to be used to perform feed forward control of the substrate that is conveyed in the same substrate processing apparatus. As a result, the target value that reflects the atmosphere changes inside of the substrate processing apparatus continues to be used, thereby making it possible to precisely process the substrate conveyed in the same substrate processing apparatus from immediately after starting the post-change process.

A configuration may be adopted in which, the process execution control unit may optimize the target value in accordance with the processing sequence indicated in the second recipe, and may use the optimized target value to perform feed forward control for a substrate transferred in the substrate processing apparatus in accordance with the processing sequence indicated in the second recipe.

As a result of adopting the above-described configuration, in the case that the target value is not contained in the feed forward plan in particular, a target value can be optimized that is suitable for the process that is going to be performed. Moreover, it possible to precisely process the substrate transferred in the same substrate processing apparatus from immediately after starting the post-change process.

The controlling device may control a plurality of the substrate processing apparatuses, and the storage unit may store respective target values for each substrate processing apparatus such that there is a linked relationship between each one of the target values and each substrate processing apparatus. Further, the recipe adjustment unit may select, from among the plurality of target values stored in the storage unit, the stored target value that has a linked relationship with the substrate processing apparatus that the next substrate to be processed will be transferred in, and the process execution control unit may control feed forward control for the substrate transferred in the substrate processing apparatus based on the selected target value.

If this configuration is used, for example, each of the plurality of the substrate processing apparatuses that are provided in various areas within a plant can be separately and independently controlled by the controlling device. Thus, during the feedback control, respective target values that reflect the atmosphere changes inside of each substrate processing apparatus can continue to be used for each substrate processing apparatus, thereby making it possible to precisely process the substrates transferred in each substrate processing apparatus from immediately after starting the post-change process.

Note that, the specified process may also be an etching process. Other examples of the specified process include a deposition process, an ashing process, and a spattering process.

The received measurement information may also be information for computing at least one of a substrate critical dimension (CD), an etching rate, and a deposition speed. Note that the CD denotes an amount of shift in a post-etching pattern dimension in relation to a pre-etching mask dimension.

Further, According to another embodiment of the present invention, there is provided a control method for controlling a substrate processing apparatus that performs a specified process on a substrate. The method includes: storing in a storage unit a plurality of recipes that respectively indicate different processing sequences, and a specified target value that serves as a control value when the specified process is performed on the substrate; causing a measuring device to measure measurement information including a pre-processing state and a post-processing state of the substrate that is processed by the substrate processing apparatus in accordance with a processing sequence indicated in a first recipe included among the plurality of recipes stored in the storage unit; receiving the measured measurement information; computing a feedback value that corresponds to a processed state of the substrate processed in the current cycle, based on the pre-processing state and post-processing state measurement information for the substrate processed in the current cycle within the received measurement information; computing a feedback value that corresponds to a processed state of the substrate processed in the current cycle, based on the pre-processing state and the post-processing state measurement information for the substrate processed in the current cycle within the received measurement information; updating the target value stored in the storage unit using the computed feedback value; changing a recipe that indicates the substrate processing apparatus and the processing sequence performed in the same substrate processing apparatus from the first recipe to a second recipe stored in the storage unit; and controlling with feed forward control a processing of a substrate conveyed in the same substrate processing apparatus in accordance with the processing sequence indicated in the changed to second recipe while continuing to use the updated target value.

In addition, according to another embodiment of the present invention, there is also provided a storage medium that stores a control program for a substrate processing apparatus that performs a specified process on a substrate, the program causing a computer to perform a control function for the substrate processing apparatus, the control function including: a process that stores in a storage unit a plurality of recipes that respectively indicate different processing sequences, and a specified target value that serves as a control value when the specified process is performed on the substrate; a process that causes a measuring device to measure measurement information including a pre-processing state and a post-processing state of the substrate that is processed by the substrate processing apparatus in accordance with a processing sequence indicated in a first recipe included among the plurality of recipes stored in the storage unit; a process that receives the measurement information; a process that computes a feedback value that corresponds to a processed state of the substrate processed in the current cycle, based on the pre-processing state and the post-processing state measurement information for the substrate processed in the current cycle within the received measurement information; a process that updates the target value stored in the storage unit using the computed feedback value; a process that changes a recipe that indicates the substrate processing apparatus and the processing sequence performed in the same substrate processing apparatus from the first recipe to a second recipe stored in the storage unit; and a process that controls feed forward control of a substrate conveyed in the same substrate processing apparatus in accordance with the processing sequence indicated in the changed to second recipe while continuing to use the updated target value.

According to these aspects, even if the recipe that indicates the processing sequence performed in the same substrate processing apparatus is changed from the first recipe to the second recipe, the same target value continues to be used. Thus, even if a different process is performed in the same substrate processing apparatus it is possible to precisely process the substrate based on the target value that reflects the atmosphere changes inside of the substrate processing apparatus.

As explained above, according to the present invention, the target value that serves as the control value during feedback control can be optimized.

BRIEF DESCRIPTION OF THE DRAWINGS

FIG. 7 is a figure that shows examples of a portion of data that is contained in a process recipe;

DETAILED DESCRIPTION OF THE EMBODIMENTS

Figure 1:
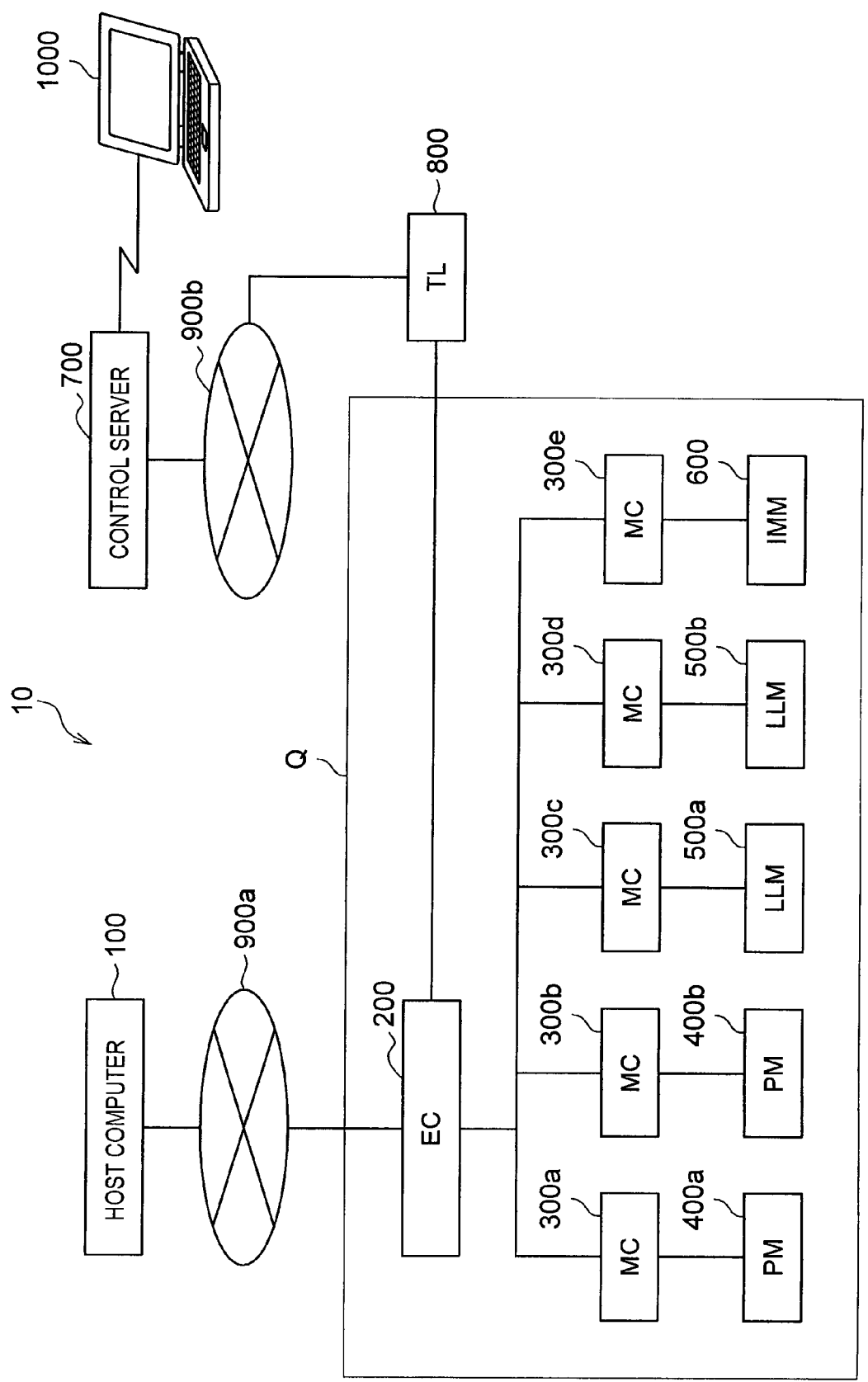
FIG. 1 is a figure that shows a substrate processing system according to a first and a second embodiment of the present invention.

Hereinafter, a preferred embodiment of the present invention will be described in detail with reference to the appended drawings. Note that, in this specification and the appended drawings, structural elements that have substantially the same function and structure are denoted with the same reference numerals, and repeated explanation of these structural elements is omitted. Note that, in this specification, 1 Torr equals (101325/760) Pa, and 1 sccm equals $(10^{-6}/60)$ m$^3$/scc.

First Embodiment

First, a general description of a substrate processing system according to the embodiment of the present invention will be provided with reference to FIG. 1. Note that in the present embodiment, a process that etches a silicon wafer (hereinafter called the "wafer") by using the substrate processing system to will be used as an example for explanatory purposes.

Substrate Processing System

A substrate processing system 10 includes a host computer 100, an equipment controller (hereinafter called the "EC") 200, five machine controllers (hereinafter called the "MCs") 300a to 300e, two process modules (hereinafter called the "PMs") 400a and 400b, two load lock modules (hereinafter called the "LLMs") 500a and 500b, one measuring instrument (hereinafter called the "integrated metrology module" (IMM)) 600, a control server 700, and a process adjustment controller (hereinafter called the "tool level" (TL)) 800.

The host computer 100 and the EC 200 are connected by a client local area network (LAN) 900a, and the control server 700 and the TL 800 are connected by a client LAN 900b. In addition, the control server 700 is connected to an information processing device, such as a personal computer (PC) 1000 or the like, and is in a state where it can be accessed by an operator.

The EC 200, the MCs 300a to 300e, the PMs 400a, 400b, the LLMs 500a, 500b, and the IMM 600 are provided in a specified area Q within a plant. The TL 800 and the EC 200, as well as the EC200 and the five MCs 300, are connected by in-plant LANs. The same sort of in-plant LANs connect each of the MCs 300 to one of the PMs 400a, 400b, the LLMs 500a, 500b, and the IMM 600.

The host computer 100 controls the entire substrate processing system 10, including data control and the like. The EC 200 stores a process recipe that is used for the process of etching a substrate. The EC 200 transmits instruction signals to each of the MCs 300 such that the desired etching process is performed on the substrate by the PMs 400a, 400b according to the process recipe. The EC 200 also performs revision history control and the like for the process recipes that are used.

The MCs 300a to 300d, by respectively controlling the PMs 400a, 400b and the LLMs 500a, 500b based on the instruction signals that are transmitted from the EC 200, control the transfer of the wafer W and control the PMs 400a, 400b such that they perform the etching process according to the process recipe. Data that indicate changes in the process conditions (for example, changes over time in a temperature, a pressure, a gas flow volume, and the like) are transmitted from the MCs 300a to 300d to the host computer 100 through the EC 200.

The IMM 600 measures the state of the surface of the wafer W before the etching process and the processing state of the surface of the wafer W after the etching process. The measurement data are transmitted from the MC 300e to the TL 800 through the EC 200. Note that the method of measuring the state of the surface of the wafer W will be described later.

The control server 700, based on data that are transmitted from the PC 1000 by an operation of the operator, generates a strategy that sets operating conditions for each device. Specifically, the control server 700 generates a strategy that contains a system recipe to control each PM 400 that is disposed within the area Q. In addition, the control server 700 generates a feedback plan to perform a feedback control, and a feed forward plan to perform a feed forward control based on an operation of the operator.

The TL 800 stores the strategy that is generated by the control server 700. Based on the feedback plan, the TL 800 computes a pre-processing critical dimension (CD) value (CDb) and a post-processing CD value (CDa) based on the measurement information measured by the IMM 600. The TL 800 uses each CD value to compute a feedback value and uses an exponentially weighted moving average (EWMA) to compute, based on the current feedback value and a feedback value computed before the current cycle, a target value that serves as a control value during the feed forward control (the feedback control). Furthermore, based on the feed forward plan, the TL 800 controls, according to the target value computed during the feedback control, the etching process for the next wafer W that will be transferred to the PMs 400 (the feed forward control).

Hardware configurations of the PMs, the LLMs, and the IMM

Figure 2:
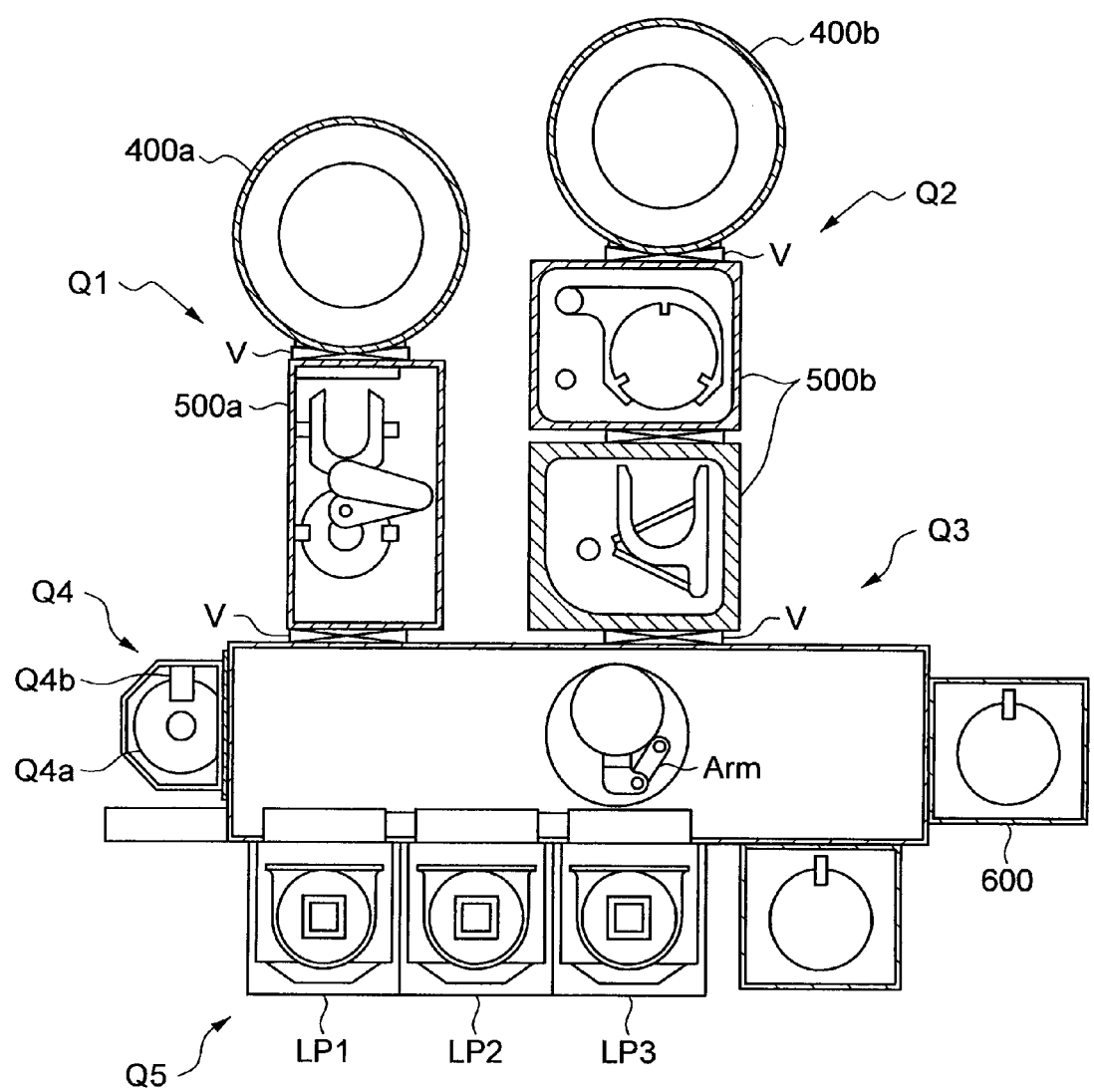
FIG. 2 is a layout drawing of various devices in a plant area Q according to the embodiments.

Next, the hardware configurations of the PMs 400, the LLMs 500, and the IMM 600 that are disposed in the specified area Q within the plant will be explained with reference to FIGS. 2 and 3. As shown in FIG. 2, a first process ship Q1, a second process ship Q2, a transfer unit Q3, an alignment mechanism Q4, and a cassette stage Q5 are disposed in the specified area Q within the plant.

The first process ship Q1 includes the PM 400a and the LLM 500a. The second process ship Q2 is arranged parallel to the first process ship Q1 and includes the PM 400b and the LLM 500b. The PMs 400a, 400b use a plasma to perform a specified process (for example, an etching process) on the wafer W. The PMs 400 correspond to the substrate processing apparatus that performs the specified processing on the substrate. The TL 800 is an example of the controlling device that controls the substrate processing apparatus. Note that details of the internal structure of the PMs 400 will be described later.

The LLMs 500*a*, 500*b* transfer the wafer W between the transfer unit Q3, which is open to the atmosphere, and the PMs 400*a*, 400*b*, which are in a vacuum state by the opening and closing of gate valves V, which are provided at both ends of the LLMs 500*a*, 500*b* and can open and close in an airtight manner.

The transfer unit Q3 is a rectangular transfer chamber and is connected to the first process ship Q1 and the second process ship Q2. The transfer unit Q3 is provided with a transfer arm (Arm), and the transfer arm (Arm) is used to transfer the wafer W to one of the first process ship Q1 and the second process ship Q2.

The alignment mechanism Q4, which performs positioning of the wafer W, is provided at one end of the transfer unit Q3. The alignment mechanism Q4 positions the wafer W by rotating a rotating platform Q4*a* on which the wafer W is placed and using an optical sensor Q4*b* to detect the state of the outer edge of the wafer W.

The IMM 600 is provided at the other end of the transfer unit Q3. As shown in the lower portion of FIG. 5, the IMM 600 includes an optical portion 605. The optical portion 605 includes a light-emitting device 605*a*, a light polarizer 605*b*, an analyzer 605*c*, and a light-receiving device 605*d*.

The light-emitting device 605*a* outputs white light in the direction of the wafer W. The light polarizer 605*b* converts the output white light to linear polarized light, then irradiates the wafer W, which is placed on a stage S. From the elliptically polarized light that is reflected from the wafer W, the analyzer 605*c* allows only the polarized light with a specific polarized angle to pass through. The light-receiving device 605*d* is made up of a charge-coupled device (CCD) camera or the like, for example, and receives the polarized light that passes through the analyzer 605*c*. The light-receiving device 605*d* converts the received polarized light into an electrical signal and outputs the converted electrical signal to the MC 300*e*. The electrical signal that is output to the MC 300*e* is transmitted to the TL 800 through the EC 200.

Returning to FIG. 2, the cassette stage Q5 is provided on a side face of the transfer unit Q3. Three cassette holders LP1 to LP3 are placed on the cassette stage Q5. A maximum of twenty-five wafers W, for example, is accommodated on a plurality of levels in each cassette holder LP.

If the configuration described above is used, the transfer unit Q3 transfers the wafer W among the cassette stage Q5, the alignment mechanism Q4, the IMM 600, and the processing ships Q1, Q2.

Figure 3:
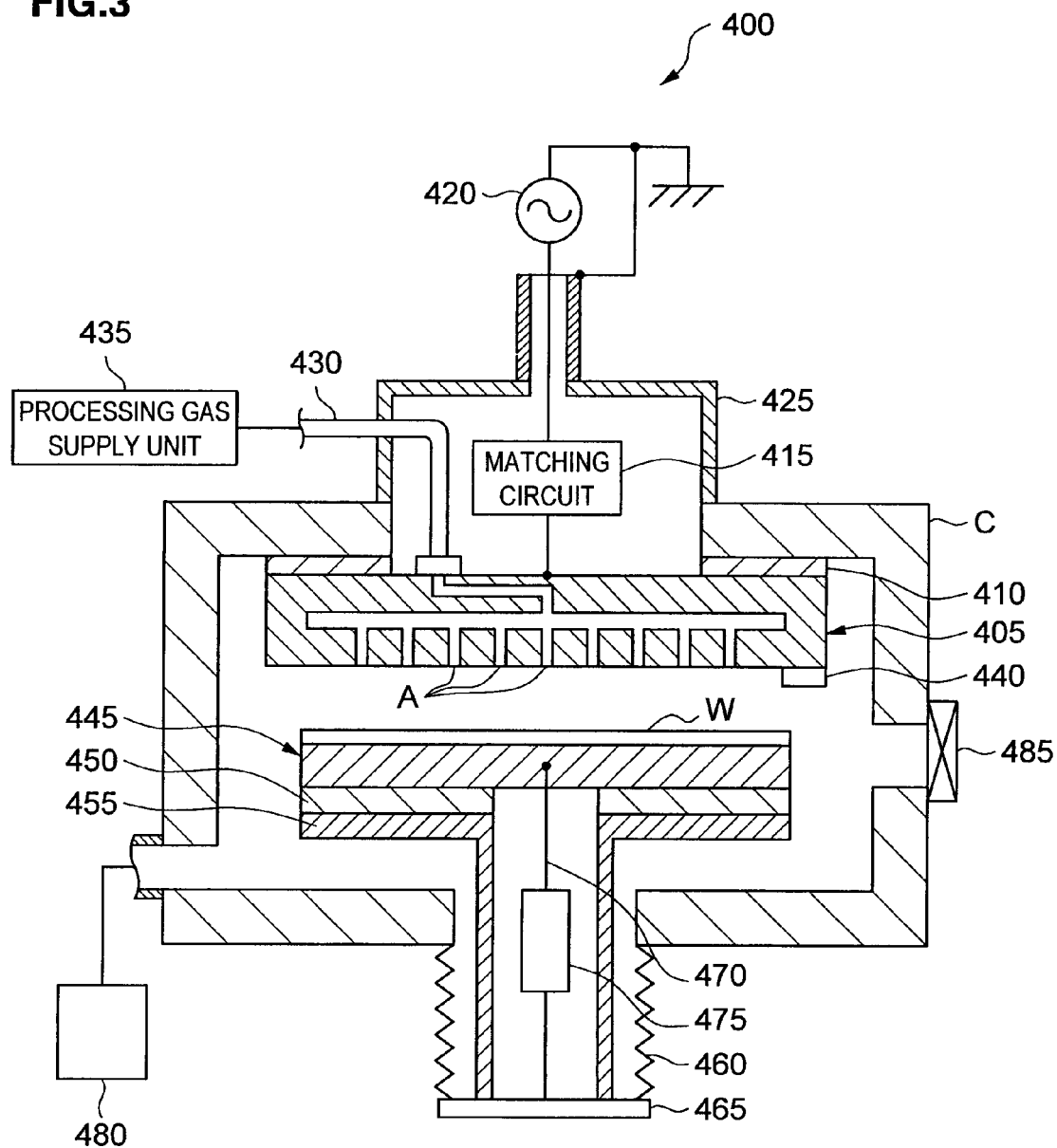
FIG. 3 is a figure that schematically shows a vertical cross section of a process module (PM) according to the embodiments.

Internal structure of the PMs The internal structure of the PMs 400 will be explained with reference to a vertical cross section of the PMs 400 that is schematically shown in FIG. 3.

Each of the PMs 400 has a rectangular tube-shaped processing container C that has openings approximately in a center portion of its top portion and approximately in a center portion of its bottom portion. The processing container C is built, for example, from aluminum with an anodized surface.

An upper electrode 405 is provided in an upper portion of the interior of the processing container C. The upper electrode 405 is electrically isolated from the processing container C by an insulating material 410 that is provided around the edge of the opening in the top portion of the processing container C. A high-frequency power supply 420 is connected to the upper electrode 405 through a matching circuit 415. A matching box 425 is provided that surrounds the matching circuit 415 and serves as a grounded housing for the matching circuit 415.

A processing gas supply portion 435 is connected to the upper electrode 405 by a gas line 430. A desired processing gas that is supplied by the processing gas supply portion 435 is introduced into the processing container C through a plurality of gas injection holes A. Thus the upper electrode 405 functions as a gas shower head. A temperature sensor 440 is provided on the upper electrode 405. The temperature sensor 440 detects the temperature of the upper electrode 405 as the temperature inside the processing container C.

A lower electrode 445 is provided in a lower portion of the interior of the processing container C. The lower electrode 445 functions as a susceptor on which the wafer W is placed. The lower electrode 445 is supported through an insulating material 450 by a support 455. The lower electrode 445 is thus electrically isolated from the processing container C.

One end of a bellows 460 is attached close to the perimeter of the opening that is provided in the bottom face of the processing container C. An elevating plate 465 is affixed to the other end of the bellows 460. According to this configuration, the opening in the bottom face of the processing container C is sealed by the bellows 460 and the elevating plate 465. Furthermore, the bellows 460 and the elevating plate 465 elevate as a single unit to adjust the position of the lower electrode 445 on which the wafer W is placed to a height that is appropriate to the processing.

The lower electrode 445 is connected to the elevating plate 465 through an electrically conductive path 470 and an impedance adjustment portion 475. The upper electrode 405 and the lower electrode 445 respectively correspond to a cathode electrode and an anode electrode. The pressure in the interior of the processing container C is lowered to a desired degree of vacuum by an exhaust mechanism 480. According to this configuration, with the wafer W having been conveyed into the interior of the processing container C, high-frequency electric power is applied to excite the gas that is supplied to the interior of the processing container C and generate a plasma, while the airtightness of the processing container C is maintained by the opening and closing of a gate valve 485. The desired etching of the wafer W is performed by the action of the generated plasma.

Hardware Configurations of the TL

Next, the hardware configuration of the TL 800 will be explained with reference to FIG. 4. Note that the hardware configurations of the EC 200, the MCs 300, the control server 700, and the host computer 100 are the same as that of the TL 800, so explanation of these configurations is omitted.

Figure 4:
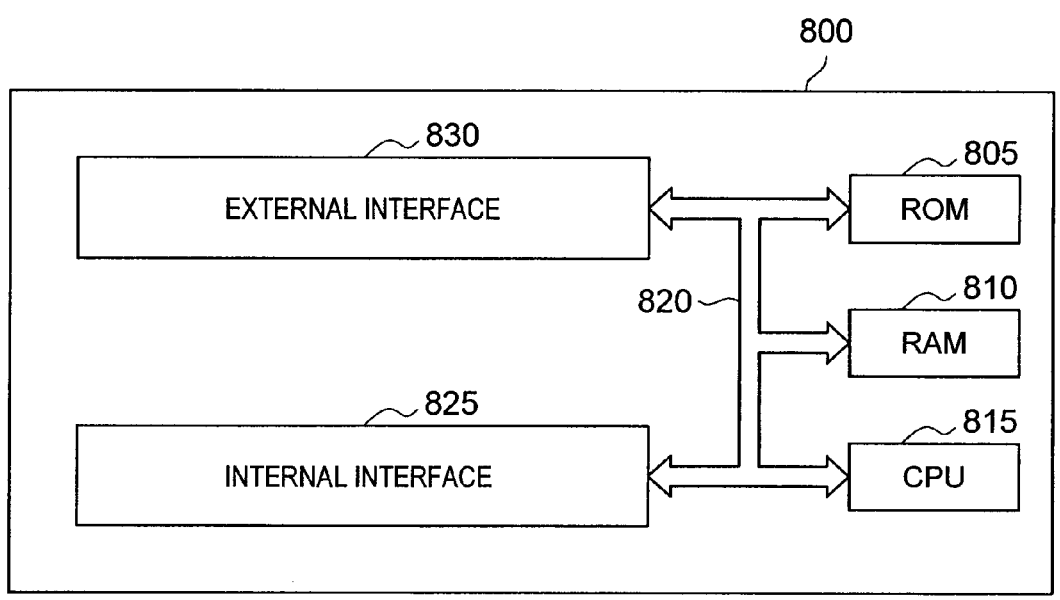
FIG. 4 is a hardware configuration diagram that shows a tool level (TL) and the like according to the embodiments.

As shown in FIG. 4, the TL 800 includes a ROM 805, a RAM 810, a CPU 815, a bus 820, an internal interface (internal I/F) 825, and an external interface (external I/F) 830.

A basic program that is run by the TL 800, a program that is run when an abnormality occurs, various types of recipes, and the like are stored in the ROM 805. Various types of programs and data are stored in the RAM 810. Note that the ROM 805 and the RAM 810 are examples of storage devices and may be storage devices such as EEPROMs, optical disks, magneto-optical disks, and the like.

The CPU 815 controls the substrate processing according to the various types of recipes. The bus 820 is the path by which data is exchanged among the ROM 805, the RAM 810, the CPU 815, the internal interface 825, and the external interface 830.

The internal interface 825 inputs data and outputs required data to a monitor, a speaker, and the like that are not shown in the drawings. The external interface 830 transmits and receives data among devices that are connected in a network such as a LAN or the like.

Functional Configuration of the TL 800

Next, various functions of the TL 800 will be explained with reference to FIG. 5, which shows the functions as blocks.

The TL 800 includes the functions shown by the various blocks, including a storage unit 850, a communication unit 855, a data base 860, a computation unit 865, an update unit 870, a recipe adjustment unit 875, and a process execution control unit 880.

Figure 6:
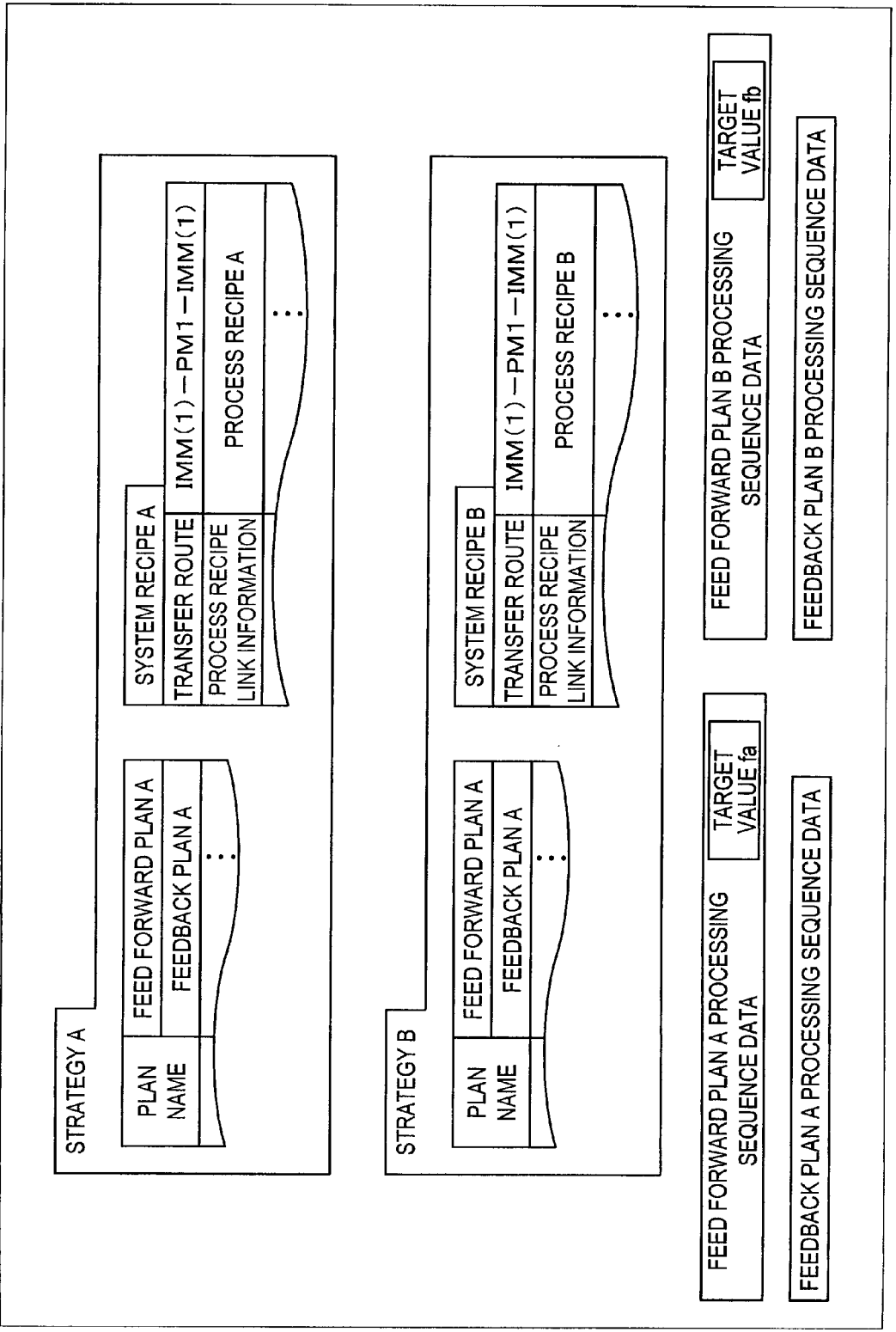
FIG. 6 is a figure that shows examples of a portion of data that is stored in a storage unit according to the first embodiment.

As shown in FIG. 6, the storage unit 850 stores a plurality of strategies that set the operating conditions for performing various types of processes (in this case, a strategy A and a strategy B), a plurality of feed forward plans that indicate a processing sequence for the feed forward control (in this case, feed forward plan A and feed forward plan B), and a plurality of feedback plans that indicate the processing sequence for the feedback control (in this case, feedback plan A and feedback plan B). The storage unit 850 stores the strategies or each type of plans that are sent from the control server 700 at a point when communication with the control server 700 is established and at a point when it becomes possible for a new strategy or a new type of plan to be used. In addition, at a point when it becomes impossible to use any given stored strategy or type of plan, the storage unit 850 deletes the strategy or type of plan in question.

Each strategy contains the content of the system recipe and a plan name designated by each strategy. The system recipe indicates the sequence for the process of etching the wafer W. The plan name is a feed forward plan name or a feedback plan name. The feed forward plan name is one example of information for identifying the feed forward plan, and the feedback plan name is one example of information for identifying the feedback plan. However, for example, an identification code may be provided instead of a plan name.

In this example, the strategy A contains the content of a system recipe A, and is set with the feed forward plan A and the feedback plan A for the plan names. In addition, for example, the strategy B contains the content of a system recipe B, and is set with feed forward plan A and the feed back plan A for the plan names.

The system recipes A, B contain transfer routes for the wafer W in the strategies A, B and link information for an applicable process recipe. For example, the system recipe A indicates, based on the transfer route, that the wafer W is transferred to an IMM (1) (the IMM 600), then is transferred to a PM 1 (the PM 400a), and finally is transferred again to the IMM (1 (the IMM 600)). The system recipe A also indicates, based on the link information for the applicable process recipe, that the wafer W is etched according to a processing sequence of the linked process recipe (for example, in the process recipe A that is shown in FIG. 7).

Data indicating the processing sequence of the feed forward plans A, B and data indicating the processing sequence of the feedback plans A, B is stored separately and independently without being linked to each strategy.

The feed forward plans A, B contain the target values f (fa, fb) that serve as the control values when the etching process is performed on the wafer W. Note that, the target values f (fa, fb) contained in the feed forward plans A, B indicate the most recent target values that have been updated (by feedback) by the feedback plans A, B. In the present embodiment, etching amounts per unit time are used as one example of the target values f.

The communication unit 855 receives, through the MC 300e and the EC 200, the measurement information that indicates the processing state of the surface of the wafer W and that was measured by the IMM 600 and converted into an electrical signal, as described above. Specifically, every time the wafer W is conveyed into the IMM 600 based on the transfer route indicated in the system recipe, the processing state of the surface of the wafer W is measured and the measured value is converted into the electrical signal that the communication unit 855 receives as the measurement information. Therefore, in the case where the transfer route is the IMM (1) to the PM 1 to the IMM (1), for each wafer W, the communication unit 855 receives as the measurement information the state of the wafer W before it is etched by the PM 1 and receives as the measurement information the state of the wafer W after it is etched by the PM 1. The measurement information that is received by the communication unit 855 is stored and accumulated in the data base 860.

Based on the measurement information from before and after the current etching process, which is in the measurement information that is received by the communication unit 855 and accumulated in the data base 860, the computation unit 865 computes a feedback value $f_x$ that corresponds to the processed state of the currently processed wafer W. In addition, the computation unit 865 computes a change amount AFB of the currently computed feedback value with respect to one of the previously computed feedback values $f_{x-1} \ldots f_1$. Note that, in the present embodiment, the feedback value $f_{x-1}$ computed at last time is used as the one example of the previously computed feedback values $f_{x-1}$.

In order to compute the feedback value $f_x$, the computation unit 865 first computes the pre-processing CD value (CDb in FIG. 9A), which is based on the measurement information from before the etching process, and the post-processing CD value (CDa in FIG. 9G), which is based on the measurement information from after the etching process.

Specifically, the computation unit 865 uses the equations below to determine the structure of the surface of the wafer W by ellipsometry based on the phase difference A between the incident light and the reflected light and on the amplitude displacement ψ, which are contained in the measurement information. The computation unit 865 then computes the CD value.

Phase difference $\Delta = (Wp-Ws)_{Reflected\ light} - (Wp-Ws)_{Incident\ light}$ Note that Wp is the phase of a p component wave of one of the incident light or the reflected light, and Ws is the phase of an s component wave of one of the incident light or the reflected light.

Amplitude displacement $\omega = \tan^{-1} [Rp/Rs], Rp = (I_{Reflected\ light}/I_{Incident\ light})p, Rs = (I_{Reflected\ light}/I_{Incident\ light})s$ Note that Ip is the intensity of the p component wave of one of the incident light or the reflected light, and is the intensity of the s component wave of one of the incident light or the reflected light. Rp is the reflectance ratio of the p component wave, Rs is the reflectance ratio of the s component wave.

Based on the structure of the surface of the wafer W that has been determined in this manner, the computation unit 865 determines the pre-post-processing CD value, then computes the extent to which the actual amount of material removed from the wafer W deviates from the target value. Based on the amount of the deviation, the computation unit 865 computes an optimum etching amount per unit time as the feedback value $f_x$.

The update unit 870 updates the target value based on the feedback value computed by the computation unit 865. In computing the target value, the computation unit 865 uses a type of moving average called an exponentially weighted moving average (EWMA) as a method of obtaining an average of the values of the feedback values $f_x$ over a period of time, gradually shifting the period of time for which the average is obtained to provide the moving average. EWMA is an exponential smoothing method that applies weighting such that the most recent feedback value $f_x$ is treated as more important than the past feedback values $f_x$. More specifically, the update unit 870 applies a determined weight to a group of feedback values for a period including the current feedback value using EWMA, and computes the target value using the obtained average.

The recipe adjustment unit 875 changes from the recipe stored in the storage unit 850, which is a recipe that indicates the processing sequence performed in the same PM 400, to another recipe. For example, the recipe adjustment unit 875 may switch the strategy used for controlling the PM 400a from strategy A to strategy B as shown in FIG. 6, thereby changing the recipe indicating the processing sequence performed by the PM 400a from process recipe A to process recipe B.

Even when the recipe adjustment unit 875 has changed the recipe indicating the processing sequence performed in the same PM, namely, the PM 400a, from process recipe A to process recipe B, the feed forward plan is not changed and the same plan is selected (namely, feed forward plan A).

Note that, it is possible for the recipe adjustment unit 875 to change the feed forward plan when it changes the recipe indicating the processing sequence performed in the same PM, namely, the PM 400a, from the process recipe A to the process recipe B.

Note that, even if the recipe is changed, the same feed forward plan is automatically selected by designating the feed forward plan A that is common to the feed forward plan name of strategy A and strategy B. However, the plan selection method of the recipe adjustment unit 875, as described above, is not limited such that the feed forward plan used before the recipe is changed is used continuously by selected automatically in the recipe after changed. For example, the recipe adjustment unit 875 may perform control such that the names of a plurality of feed forward plans that are useable are displayed on the screen of the PC 1000 shown in FIG. 1, and the operator selects the same plan.

The process execution control unit 880 performs the etching process on the wafer W inside the designated PM 400 based on the sequence defined in the process recipe within the system recipe that is set in the designated strategy. In the etching process, the target value serves as the control value, and the etching process is performed on the wafer W only for a length of time in which the target amount of etching can be achieved based on the target value (etching amount per unit time).

The process execution control unit 880 has the right to access the plurality of feed forward plans stored in the storage unit 850. Accordingly, the process execution control unit 880 can access the data of the feed forward plan selected by the recipe adjustment unit 875, thereby allowing use of the data of the accessed target. In this manner, the process execution control unit 880 uses the target value included in the data of the selected feed forward plan to perform feed forward control for the substrate.

According to the function of each portion described above, the feedback control is performed by the functions of the computation unit 865 and the update unit 870. That is, the functions of the computation unit 865 and the update unit 870 update the target value that serves as the control value during the feed forward control based on the current computed feedback value $f_x$.

Furthermore, the function of the process execution control unit 880 performs the feed forward control. That is, the etching process for the next wafer W that is transferred into the PMs 400 is controlled in accordance with the updated target value based on the function of the process execution control unit 880.

Note that the functions of each portion of the TL 800 described above are actually realized by a process in which the CPU 815 in FIG. 4 reads a program from a storage medium, such as the ROM 805, the RAM 810, or the like, the program (including a recipe) describes a processing sequence that realizes the functions, and the CPU 815 interprets and executes the program. For example, in the present embodiment, the various functions of the computation unit 865, the update unit 870, the recipe adjustment unit 875, and the process execution control unit 880 are actually realized by the CPU 815's execution of a program that describes a processing sequence that realizes the functions.

Trimming Process

Before a feed forward/feedback control process is explained, a trimming process that is performed in the present embodiment will be explained. The trimming process is effective for making a finer line pattern on the wafer W. To be specific, ordinarily, when a specified pattern is formed on the wafer W, the technical limits of the exposure process and the development process make it difficult to form a mask layer with a line width less than approximately 0.07 μm. However, it is possible to form a line pattern with narrow lines without making the line width of the mask layer unreasonably narrow in the mask layer exposure process and development process by setting the line width of the mask layer in advance to a width that is wider than the line width that will be formed, then using the etching process to narrow (that is, trim) the line width.

FIGS. 8A to 8E are figures that show the transfer route for the wafer W in stages using simplified and schematized drawings of the system that is shown in FIG. 2. Further, FIGS. 9A to 9G are figures that show, in stages, the trimming process for a gate electrode that is formed from polysilicon (Poly-Si).

Figure 8A:
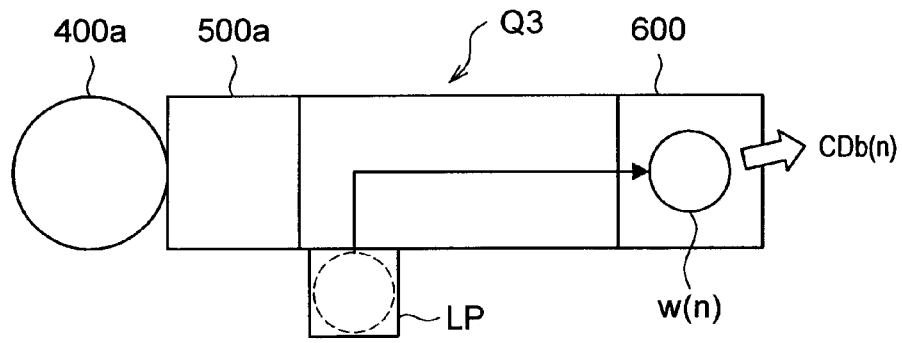
FIG. 8A is a figure that shows a stage of a transfer route for a wafer W.

In a case where the operator starts the processing of a lot and specifies the strategy A in FIG. 6, according to the system recipe A in the strategy A, the transfer route is the IMM (1) to the PM 1 to the IMM (1) (the IMM 600 to the PM 400a to the IMM 600). Accordingly, as shown in FIG. 8A, the process execution control unit 880 first uses the arm (Arm) remove the wafer W from the cassette holder LP and to grasp, then operates the transfer unit Q3 to transfer the wafer W (n), and places the wafer W on the stage S of the IMM 600.

Figure 9A:
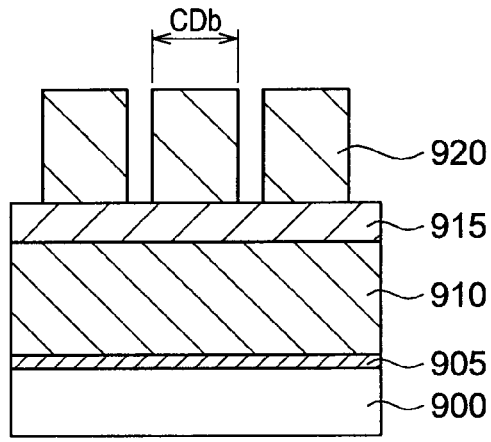
FIG. 9A is a figure that shows a stage of a trimming process for a gate electrode that is formed from polysilicon.

As shown in FIG. 9A, in the wafer W (n), a high-k layer 905, a gate electrode 910 that is formed from polysilicon, and an organic reflection-preventing film 915 are layered in that order on top of a base layer 900. A patterned photoresist film 920 is formed on top of the organic reflection-preventing film 915.

Figure 5:
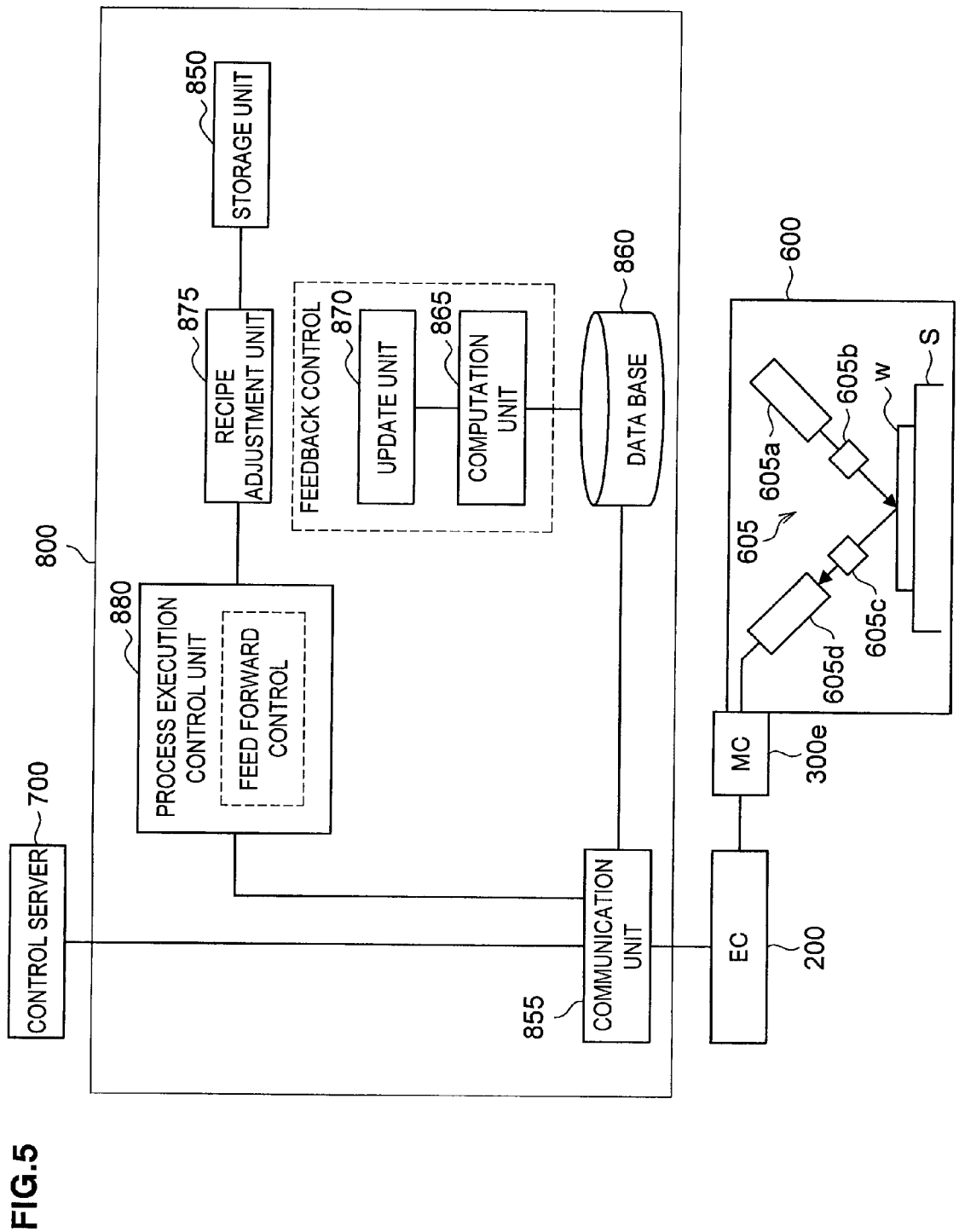
FIG. 5 is a functional configuration diagram that shows the TL according to the embodiments.

The IMM 600 uses the optical portion 605 that is shown in FIG. 5 to measure the shape of the surface of the wafer W (n) that is shown in FIG. 9A and transmits the measurement information to the communication unit 855. The communication unit 855 receives the measurement information and stores it in the data base 860. Using the measurement information that is stored in the data base 860, the computation unit 865 determines the structure of the surface of the wafer W (n) by the ellipsometry method described above and computes the pre-processing CD value (CDb in FIG. 9A). For example, assume that the pre-processing CD value (CDb) is 120 nm. In a case where the target value CD is 100 nm, the process execution control unit 880 determines that an additional 20 nm of etching is required.

Figure 8B:
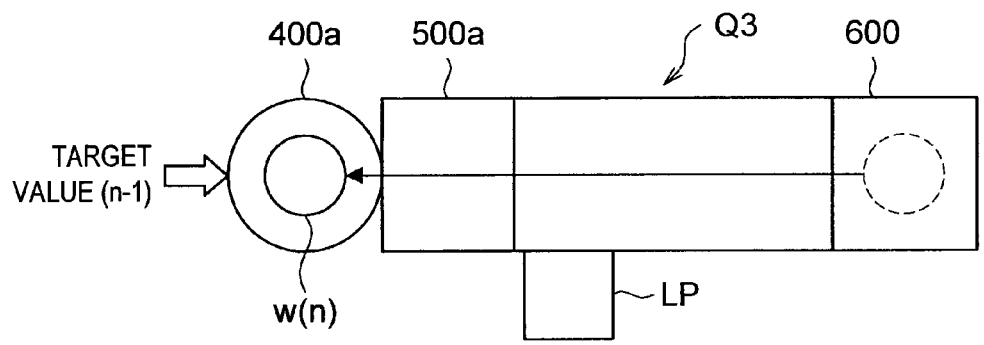
FIG. 8B is a figure that shows another stage of the transfer route for the wafer W.

After the IMM 600 measures the wafer W (n) before the processing, the process execution control unit 880, as shown in FIG. 8B, transfers the wafer W(n) to the PM 400a (the PM 1) according to the transfer route in the system recipe, then etches the wafer W(n) according to process recipe A.

At this time, the process execution control unit 880 uses the target value fa that is contained in the feed forward plan A indicated by the strategy A to process by the feed forward control on the wafer W (n) that was transferred into the PM 400a.

Figure 9B:
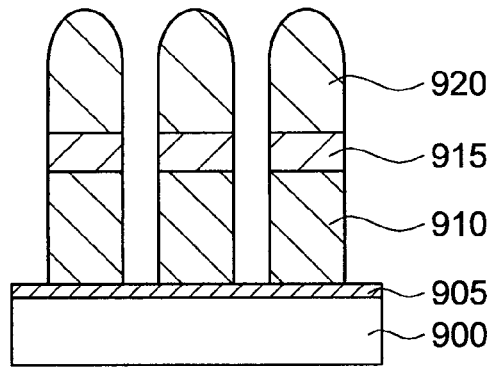
FIG. 9B is a figure that shows another stage of the trimming process for the gate electrode that is formed from polysilicon.
Figure 9C:
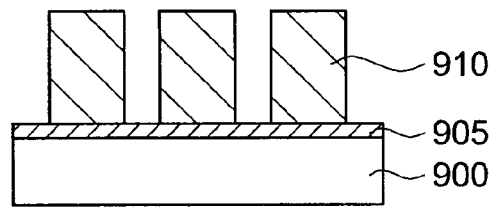
FIG. 9C is a figure that shows another stage of the trimming process for the gate electrode that is formed from polysilicon.

As a result, as shown in FIG. 9B, the gate electrode 910 and the organic reflection-preventing film 915 are partially etched away. Next, as shown in FIG. 9C, the process execution control unit 880, following the process recipe A, removes the photoresist film 920 and the organic reflection-preventing film 915 by ashing or the like.

Figure 9D:
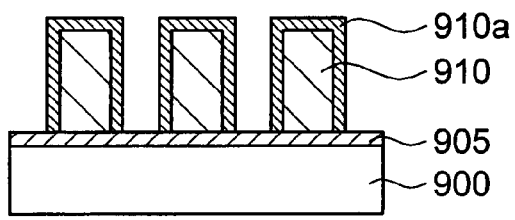
FIG. 9D is a figure that shows another stage of the trimming process for the gate electrode that is formed from polysilicon.
Figure 9E:
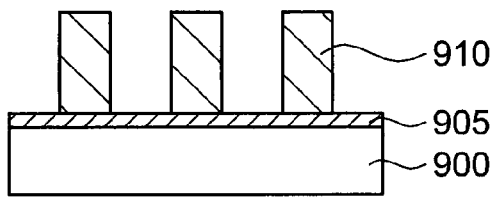
FIG. 9E is a figure that shows another stage of the trimming process for the gate electrode that is formed from polysilicon.
Figure 9F:
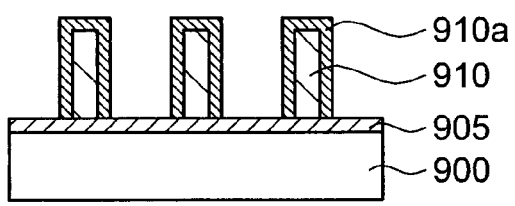
FIG. 9F is a figure that shows another stage of the trimming process for the gate electrode that is formed from polysilicon.
Figure 9G:
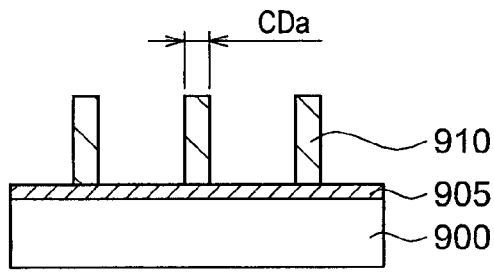
FIG. 9G is a figure that shows another stage of the trimming process for the gate electrode that is formed from polysilicon.

Next, the process execution control unit 880 performs the trimming process in FIG. 9D. Specifically, a reactive gas is sprayed isodirectionally, causing the exposed surface of the gate electrode 910 to react with the reactive gas to form a reacted layer 910a that is removed. The result, as shown in FIG. 9E, is that the width of the gate electrode 910 becomes narrower. The width of the gate electrode 910 is narrowed to the width specified in the process recipe A by repeating the trimming process (FIGS. 9F and 9G).

For example, if it is determined that an additional 20 nm of etching is required, as described above, the process execution control unit 880 predicts, based on the target value fa (20 nm of etching per 30 seconds), that 30 seconds of etching will be required to etch the 20 nm. Accordingly, the wafer W (n) is etched for 30 seconds by a mixed gas that contains at least one of chlorine (Cl2), hydrobromic acid (HBr), hydrochloric acid (HCl), carbon tetrafluoride (CF4), and sulfur hexafluoride (SF6), which are well known as etching gases.

Figure 8C:
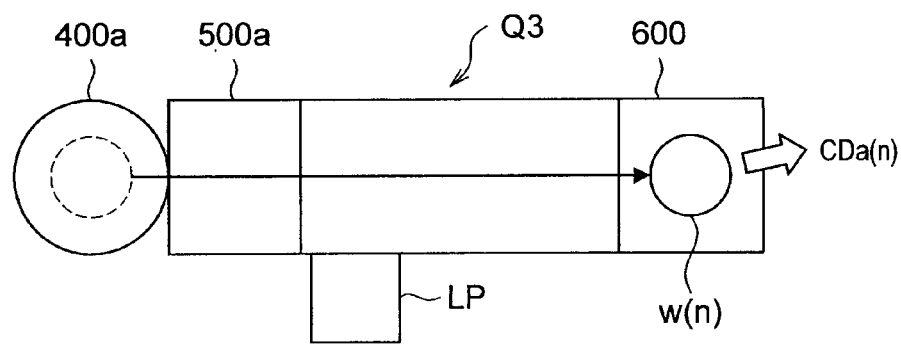
FIG. 8C is a figure that shows another stage of the transfer route for the wafer W.

After the series of plasma processes described above is performed on the wafer W (n), the process execution control unit 880 again transfers the wafer W (n) to the IMM 600, as shown in FIG. 8C, based on the transfer route in the system recipe A. The IMM 600 again uses the optical portion 605 to measure the shape of the surface of the wafer W (n) that is shown in FIG. 9G, then transmits the measurement information to the communication unit 855. The communication unit 855 receives the measurement information and stores it in the data base 860. Using the measurement information that is stored in the data base 860, the computation unit 865 determines the structure of the surface of the wafer W (n) by the ellipsometry method described above and computes the post-processing CD value (CDa in FIG. 9G).

Figure 8D:
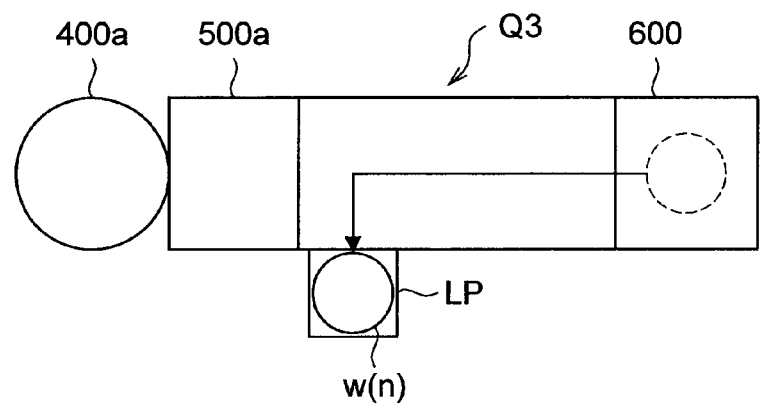
FIG. 8D is a figure that shows another stage of the transfer route for the wafer W.

For example, assume that the post-processing CD value (CDa) is 90 nm. The update unit 870 therefore determines that 30 nm of etching was done in 30 seconds. Accordingly, the update unit 870 updates (by feedback) the most recent target value f (feedback value $f_x$) from 20 nm of etching per 30 seconds to 30 nm of etching per 30 seconds. Next, as shown in FIG. 8D, the process execution control unit 880 returns the processed wafer W (n) to the cassette holder LP.

Then, before the next wafer W (n+1) is taken out, the recipe adjustment unit 875 selects strategy B from among the plurality of strategies stored in the storage unit 850, thereby changing the process recipe indicating the processing sequence performed in the PM 400a (the same PM 400) from the process recipe A to the process recipe B. At this time, the feed forward plan A is designated in the strategy B as described above. As a result, even if the process has been changed, the process execution control unit 880 continues to use the target value fa, which is contained in the feed forward plan A, without change.

Figure 8E:
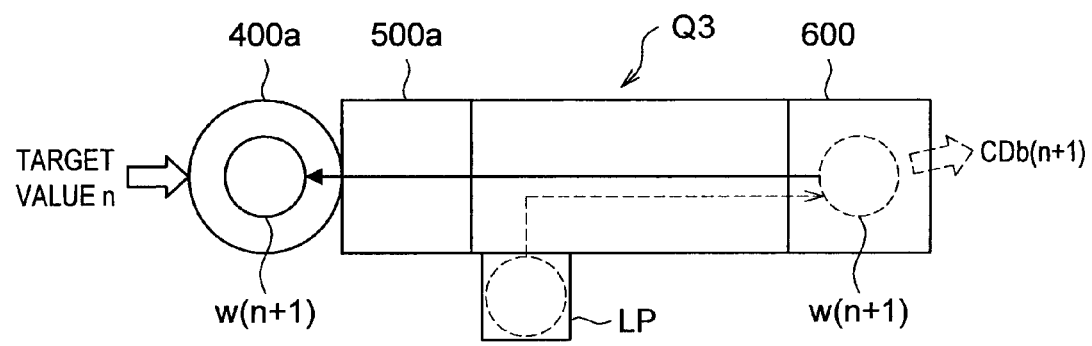
FIG. 8E is a figure that shows another stage of the transfer route for the wafer W.

Next, after measuring the pre-processing state of the wafer in the IMM 600 with respect to the next transferred in Wafer (n+1), as shown in FIG. 8E, the Wafer (n+1) is transferred to the PM 400a. In the PM 400a, the process performed on the Wafer (n+1) is changed to the process recipe B, but the target value fa continues to be used in the feed forward control.

As a result, even if a different process is performed in the same PM 400 due to changing the recipe, the target value that reflects the change of the atmosphere inside the PM 400 continues to be used, and thus it is possible to process with good precision the wafer W that is transferred into the same PM 400 as soon as the process starts to be executed following the change. More specifically, even if it is a process that requires micro-processing, the wafer W can be processed with good precision without inaccuracy of the processing. Thus, product yield can be improved, whereby it is possible to achieve productivity improvements and production cost reduction.

Common Use of Plans

To explain more specifically, in the feedback control, for example, when the etching process of the wafer W is performed, as described above, the state of the surface of the wafer W before and after the processing is measured by the IMM 600, and then the measured state of the surface of the wafer W before and after process is used as a basis for obtaining the deviation between the actual amount of material removed from the target value f. The obtained amount of deviation is then used to compute the feedback value (hereinafter referred to as "FB value") such as the etching amount per unit time. In this manner, as shown in FIG. 19, after cleaning of the PM 400, the target value f (the target value fa shown in FIG. 19), is constantly optimally adjusted so as to reflect the current atmosphere inside the PM 400.

In the feed forward control, the current target value f obtained using the feedback control is used as the control value, and this control value is used for performing the etching process of the wafer W. For example, if the target value f is an etching amount per unit time, even if the atmosphere inside the PM 400 changes gradually due to reaction product adhering to the interior wall of the PM 400 and the like, the etching amount per unit time is controlled in accordance with the changing atmosphere so that the wafer W can be processed well.

Figure 20:
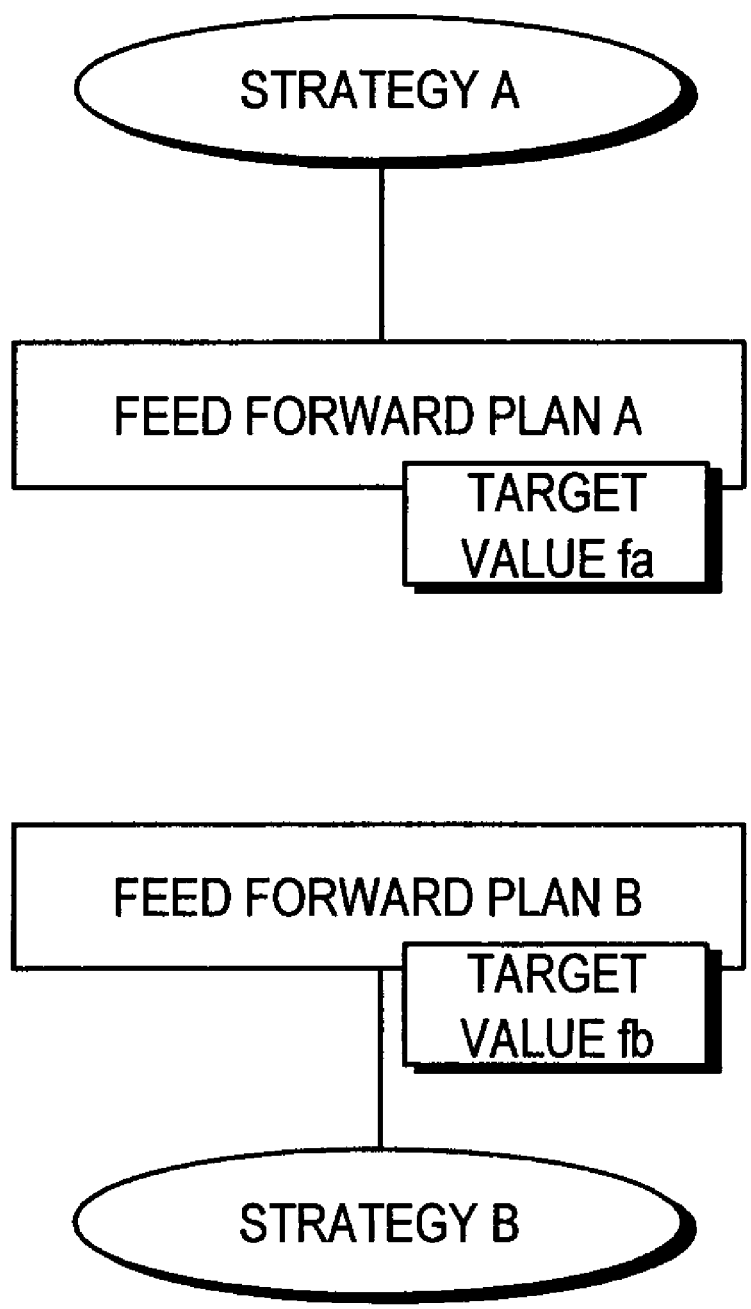
FIG. 20 is a relationship diagram that schematically shows the relationship of various data.

However, in the known technology, the same target value can not be commonly used in different processes performed in the same PM 400. For example, as shown in FIG. 20, in the known technology, each plan and each strategy are stored in the storage unit 850 in a one to one corresponding relationship. As a result, the strategy A and the strategy B have separate and different target values fa, fb, and thus the target value f is not commonly used.

Figure 19:
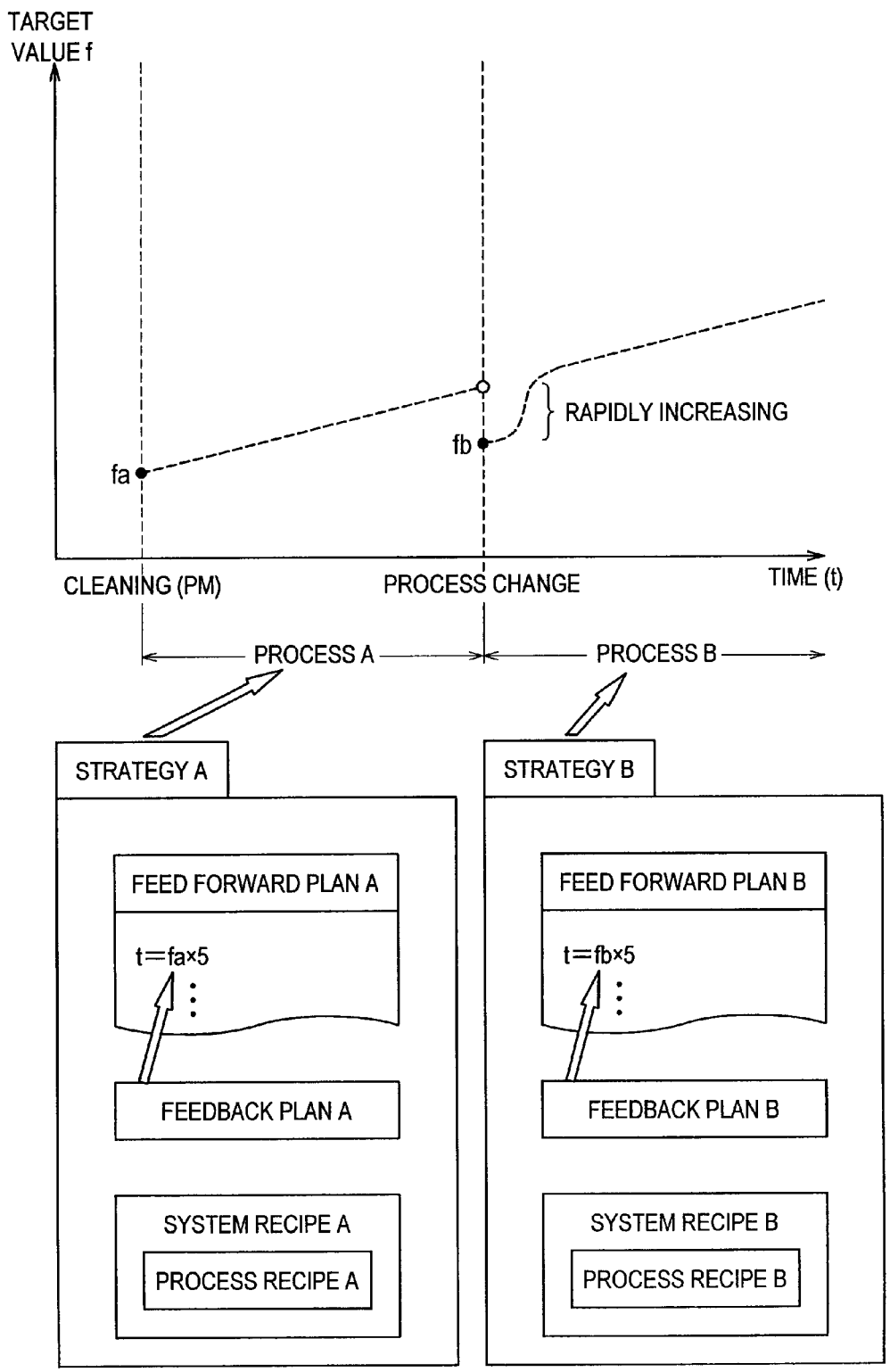
FIG. 19 is a relationship diagram that shows changes in the target value before and after process change.

Thus, as shown in FIG. 19, if the processing sequence performed in the same PM 400 is changed from the process recipe A designated in the system recipe A to the process recipe B designated in the system recipe B because the recipe adjustment unit 875 changes the selected strategy from the strategy A to the strategy B (namely, if the process performed in the PM 400 is changed from the process A to the process B), the process execution control unit 880 performs feed forward control using the target value fb contained in the feed forward plan B.

At this time, the target value fb is set, for example, to an initial value corresponding to the process condition. Even if the atmosphere inside the PM 400 gradually changes due to reaction product gradually adhering to the interior wall of the PM 400 and the like, the target value fb does not reflect this change. In addition, following this, each time the process B is performed for a plurality of wafers W, the feedback value is computed based on the processing sequence indicated in the feed back plan B, and this computation is used as a basis for updating the target value fb (by feedback). In this manner, the target value fb rapidly increases such that it approximates an ideal value that reflects the atmosphere inside the PM 400, and following this gradually changes to reflect the atmosphere inside the PM 400 while maintaining a stable state (refer to the graph of FIG. 19).

In the case that the processes A, B are processes in which micro-processing is performed, more precise control is required as compared to the process performed in the known technology. More specifically, while the target value fb changes exponentially immediately after process change, the target value used to perform feed forward control of the wafer W does not reflect the atmosphere inside the PM 400, and thus the etching process may deteriorate so as to the etching of the wafer W being insufficient or too much material may being removed. As a result, the finished product after the etching process will have less value as a commercial product and yield will be reduced, which in turn will cause reduced productivity and increase costs of production.

Figure 10:
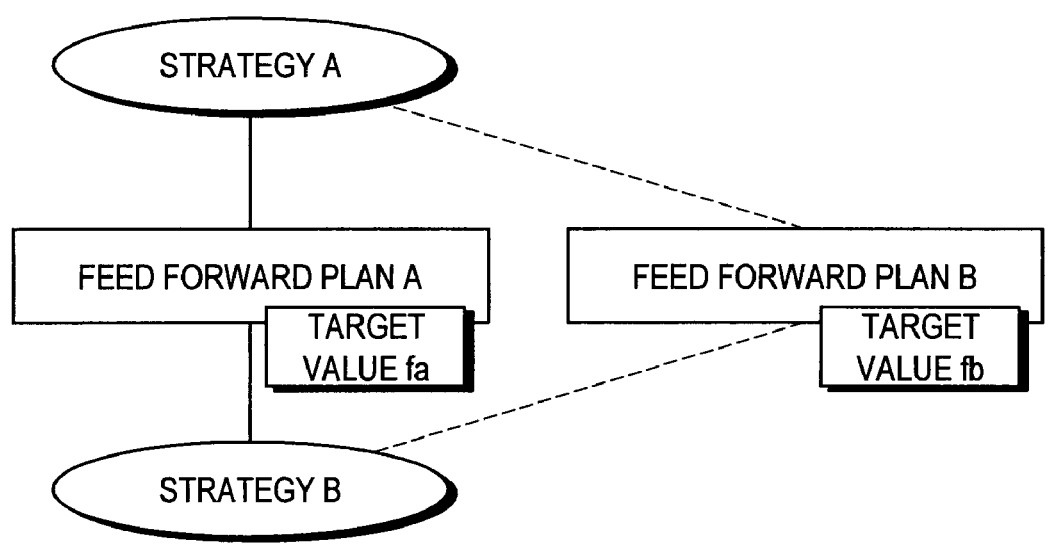
FIG. 10 is a figure that schematically shows the relationship of various data in the first embodiment.

On the other hand, according to the TL 800 of the present embodiment, each plan and each strategy is not linked and is not stored with a one to one relationship as indicated in the storage unit 850 in FIG. 6. Accordingly, as shown in FIG. 10, the strategies A, B can commonly use the feed forward plans A, B (with a linked relationship).

More specifically, even when the recipe adjustment unit 875 has switched the recipe that indicates the processing sequence performed in the same PM 400 from a first recipe (for example, the process recipe A) to a second recipe (for example, the process recipe B), the feed forward plan is not changed and thus the same feed forward plan A can be selected.

The process execution control unit 880 has the right to access the plurality of feed forward plans A, B stored in the storage unit 850. More specifically, the process execution control unit 880 can used any of the plurality of the feed forward plans stored in the storage unit 850. As a result, even if the process in the same PM 400 is changed, the feed forward plan is commonly used and thus the target value contained in the plan can be commonly used.

Figure 11:
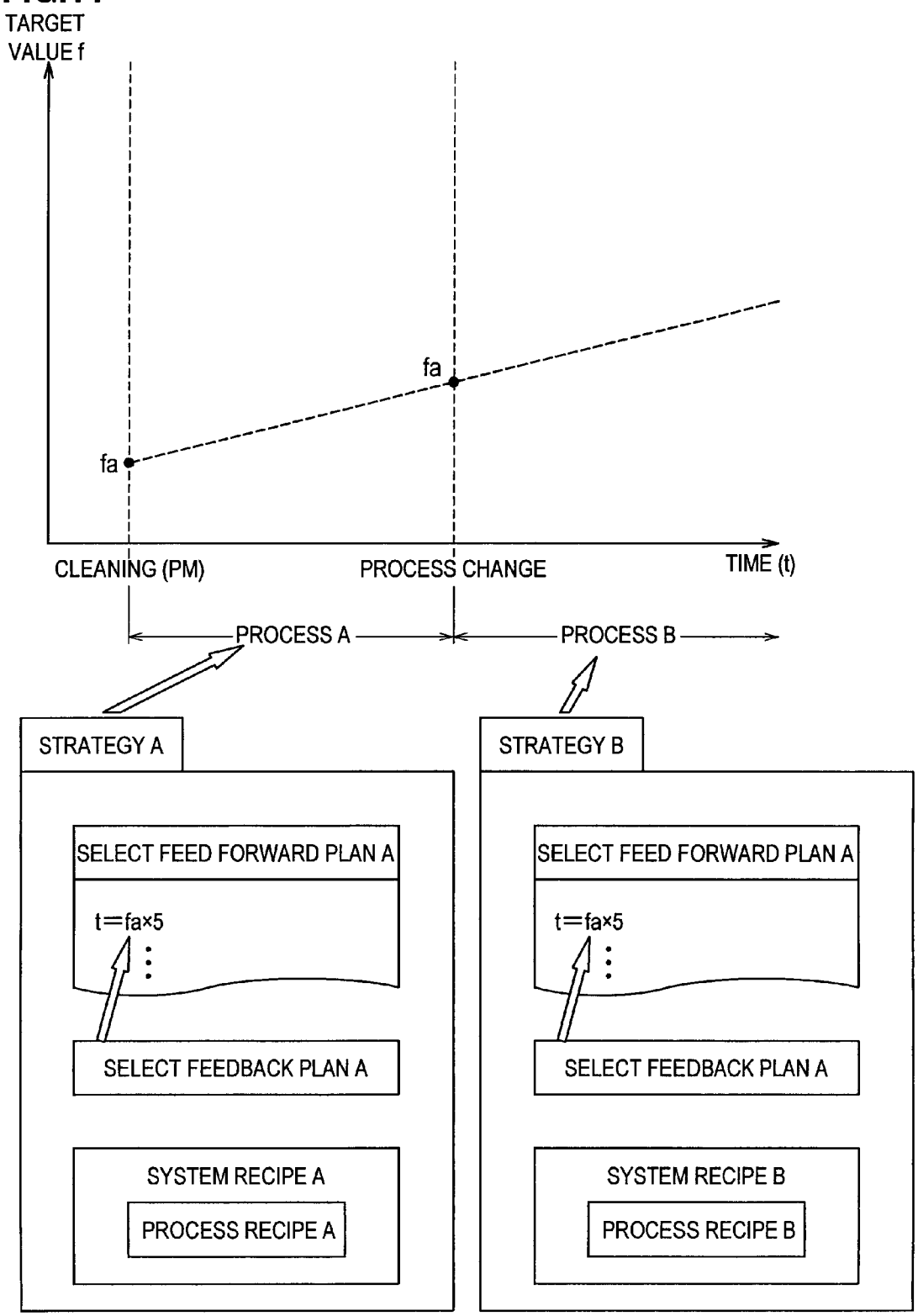
FIG. 11 is a figure that shows the changes of a target value before and after process change in the first embodiment.

As a result, as shown in FIG. 11, even after the process has been changed, the process execution control unit 880 continues using the target value fa contained in the feed forward plan A selected by the recipe adjustment unit 875, and thus feed forward control can be accurately performed for the wafer W transferred into the same PM 400 in accordance with changes in the atmosphere of the PM 400.

In this manner, feed forward control is performed for the wafer W using the target value fa that reflects the atmosphere inside the PM 400 from immediately after the process is changed, whereby it is possible to inhibit inaccuracy of the etching process caused by etching of the wafer W being insufficient or too much material being removed. Therefore, even if the process includes micro-machining, etching of the wafer W is performed well, thereby allowing yield improvement. As a result, high productivity can be maintained and production costs can be kept low.

Next, the substrate processing system 10 according to a second embodiment will be explained. In the second embodiment, target value f stored in the storage unit 850 is not contained in the feed forward plan but is stored separately from the feed forward plan. The second embodiment is different at this point from the first embodiment, in which the target value f is contained in the feed forward plan. Accordingly, the explanation of the substrate processing system 10 according to the present embodiment will focus on this point of difference.

Figure 12:
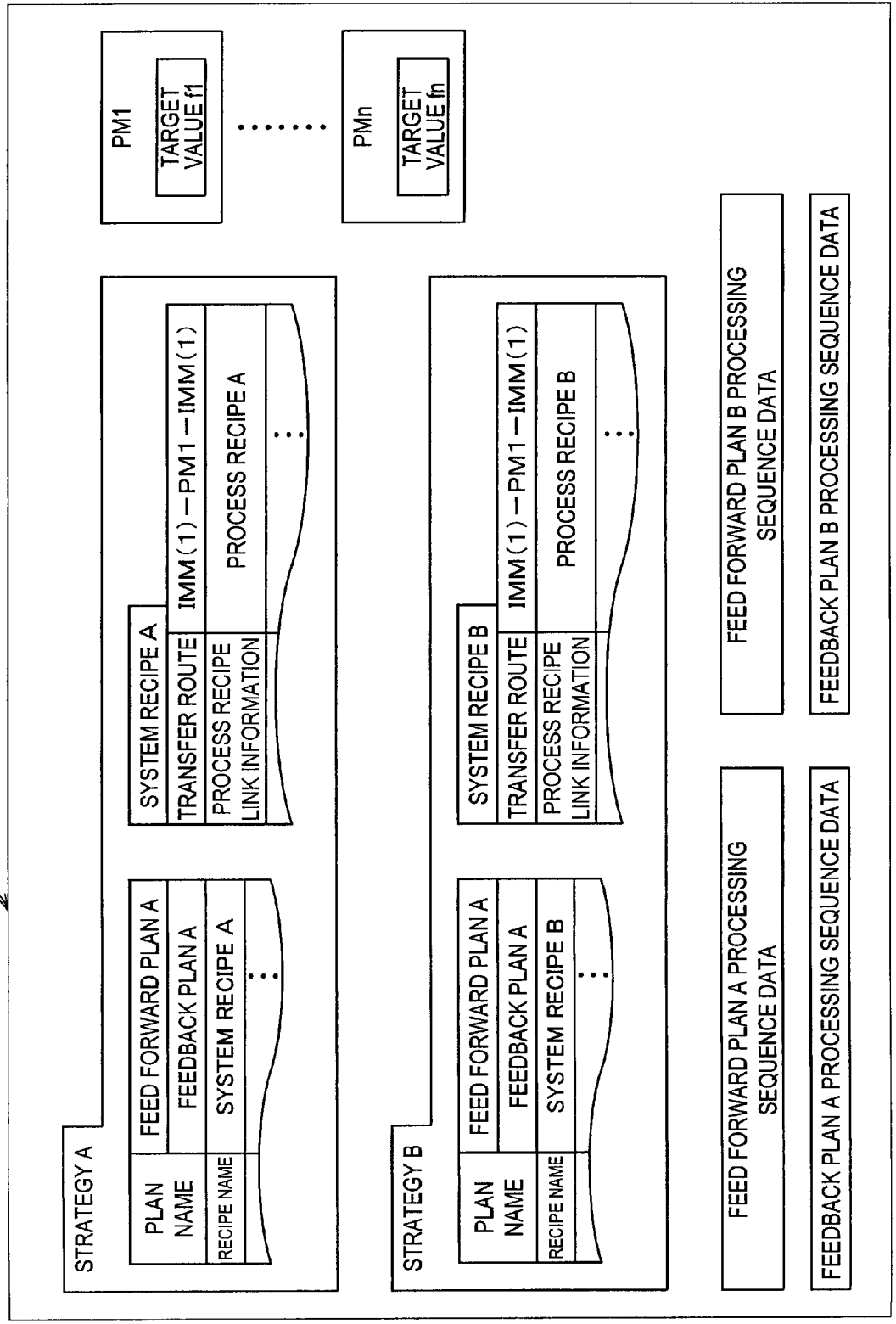
FIG. 12 is a figure that shows examples of a portion of data that is stored in a storage unit according to the second embodiment.

As comparison of the storage unit 850 according to the second embodiment (FIG. 12) and the storage unit 850 according to the first embodiment (FIG. 6) will make clear, in the storage unit 850 according to the second embodiment, the target value f is not contained in the feed forward plan, and is stored separately from the feed forward plans without having a linked relationship with each feed forward plan. Note that, the target values f1 to fn are values that respectively reflect the atmosphere inside the PM 1 to PMn, and thus the target values f1 to fn are stored for each PM 400 with a relationship to each PM 400.

Figure 13:
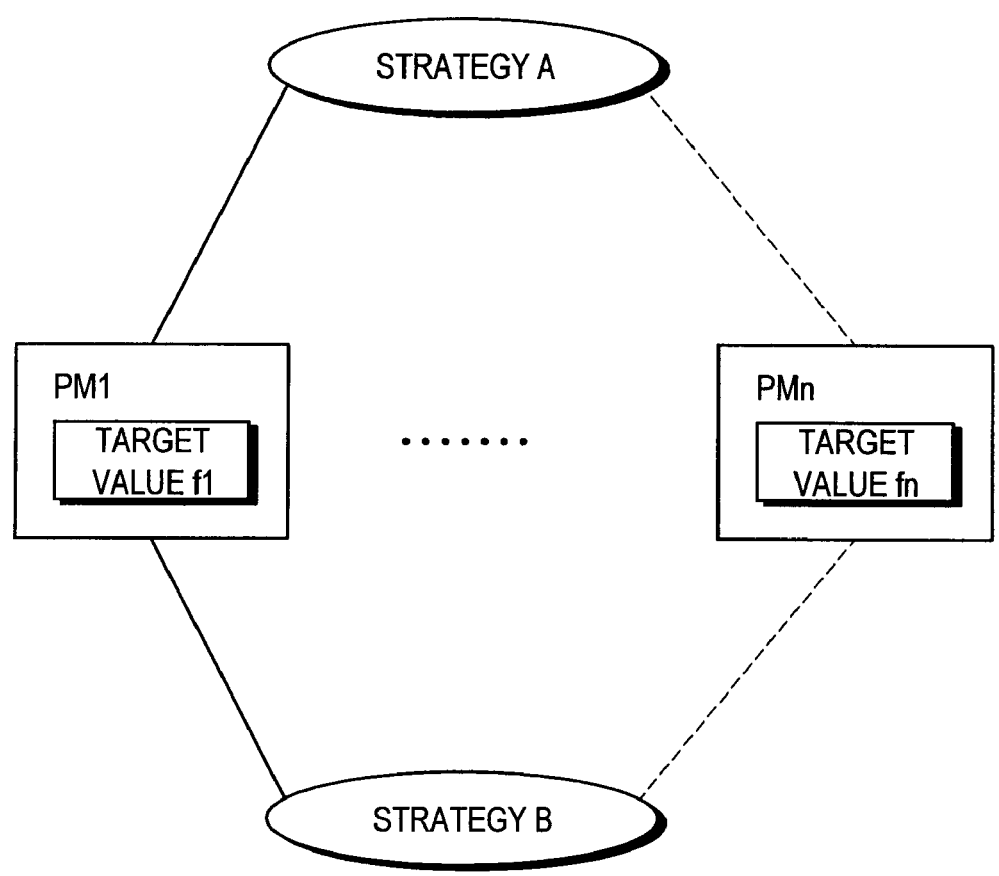
FIG. 13 is a figure that schematically shows the relationship of various data in the second embodiment.

It is not the case that in the storage unit 850 according to the present embodiment each target value and each strategy are linked and stored with a one to one relationship. Thus, as shown in FIG. 13, the strategies A, B can share and commonly use (create a linked relationship) the target values f1 to fn.

More specifically, even when the recipe adjustment unit 875 has changed the recipe indicating the processing sequence performed in the same PM 1 from the process recipe A to the process recipe B, the target value f1 that is stored with a link to the PM 1 in the storage unit 850 (the PM that the next wafer W to be processed is conveyed in) can continue to be selected.

The process execution control unit 880 has the right to access any of the target values f1 to fn stored in the storage unit 850. More specifically, the process execution control unit 880 can use any of the plurality of target values stored in the storage unit 850. In this manner, even if the process performed in the same PM 400 is changed, the target value can be commonly used.

Figure 14:
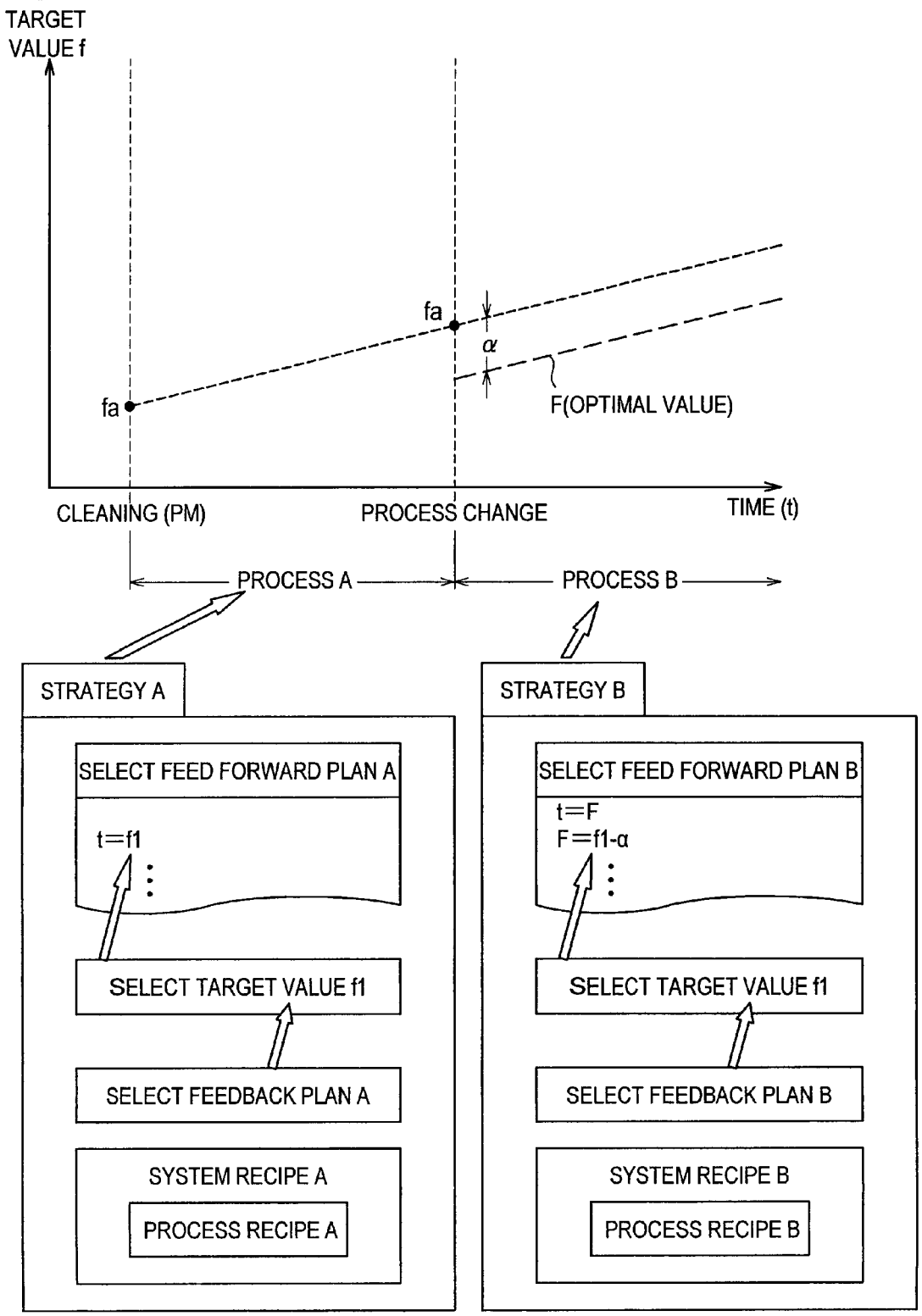
FIG. 14 is a figure that shows the changes of a target value before and after process change in the second embodiment.

As a result of adopting the above-described configuration, as shown in FIG. 14, the process execution control unit 880 can perform feed forward control well for the wafer W conveyed into the same PM 400 in accordance with changes in the atmosphere inside the PM 400 by continuing using the target value f1 selected by the recipe adjustment unit 875.

In this way, feed forward control is performed for the wafer W using the target value f1 that reflects the atmosphere inside the PM 400 from immediately after the process is changed, whereby it is possible to inhibit inaccuracy of the etching process caused by etching of the wafer W being insufficient or too much material being removed. Therefore, even if the process includes micro-machining, etching of the wafer W is performed well, thereby allowing yield improvement. As a result, high productivity can be maintained and production costs can be kept low.

In addition, in the case of the present embodiment, the feed forward plans and the target values f do not have a one to one relationship. Accordingly, as can be seen from the strategy A shown in FIG. 14, when the process A is being performed, the recipe adjustment unit 875 can select the target value f1, the feed forward plan A, and the feed back plan A, and when the process B is being performed, the recipe adjustment unit 875 can select the target value f1, the feed forward plan B, and the feed back plan B.

Figure 15:
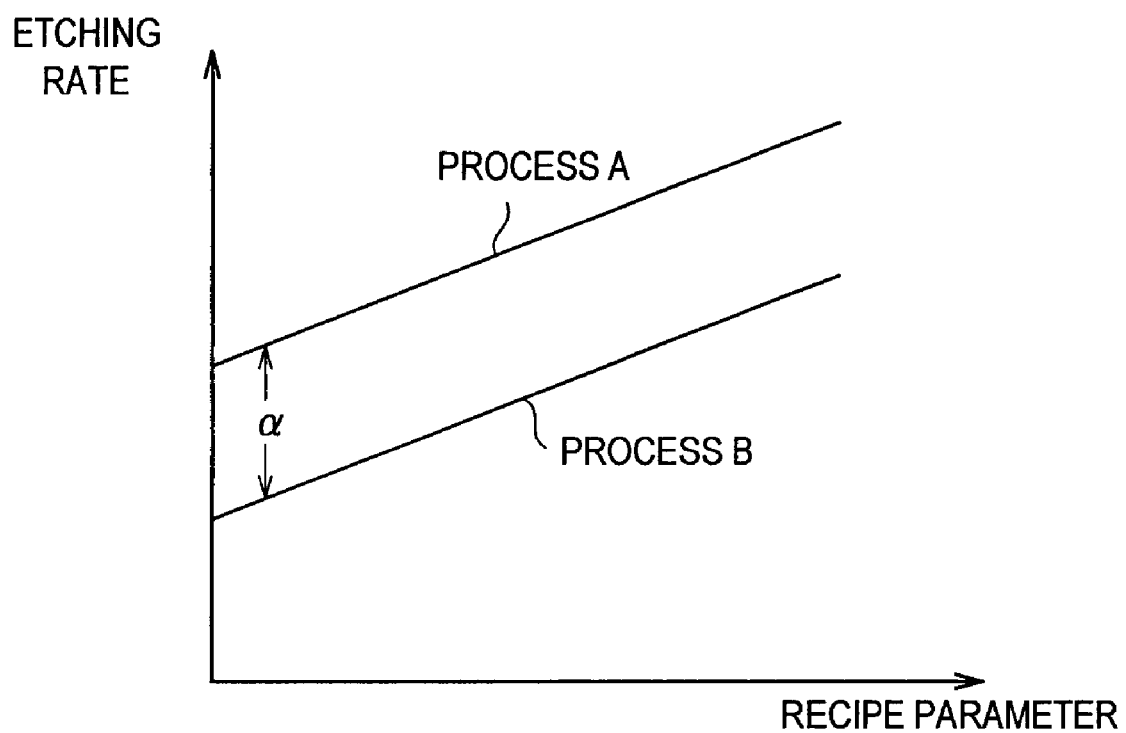
FIG. 15 is a figure that shows how an etching rate is different when a different process is performed.

For example, as shown in FIG. 15, when the etching rate of the process B is equal to "(the etching rate of process A)$-\alpha$", a given target values and a given plan can be selected as described above such that "the target value f1$-\alpha$" is set to an optimal target value F (for example, the etching process time) in the feed forward plan B. More specifically, in the present embodiment, as a result of selecting the target values and the feed forward plans separately, it is possible to optimize the target value to match the process, and thus the feed forward control can be performed even more accurately in alignment with the process based on an optimized target value.

As explained above, according to each embodiment it is possible to optimize the target value that serves as the control value when performing feed forward control.

Note that, the measurement information received by the communication unit 855 is not limited to the critical dimension (CD) of the wafer W, but may also be the etching rate, or the deposition rate.

In addition, the determined target value may be a parameter that serves as a process condition. Examples include the processing time of the substrate, a pressure, a power, the temperature at a specified position in the substrate processing apparatus, a mixture ratio of a plurality of types of gases, and a gas flow volume.

Note that, the inside of the PM 400 is periodically cleaned. Thus, when the etching process is performed again on a wafer W conveyed in the PM 400 after cleaning, an initial value for the target value that is pre-set based on the process condition is used to perform the feed forward control for the wafer W again.

Example 1 of change in the layout of the various devices in the area Q

Figure 16:
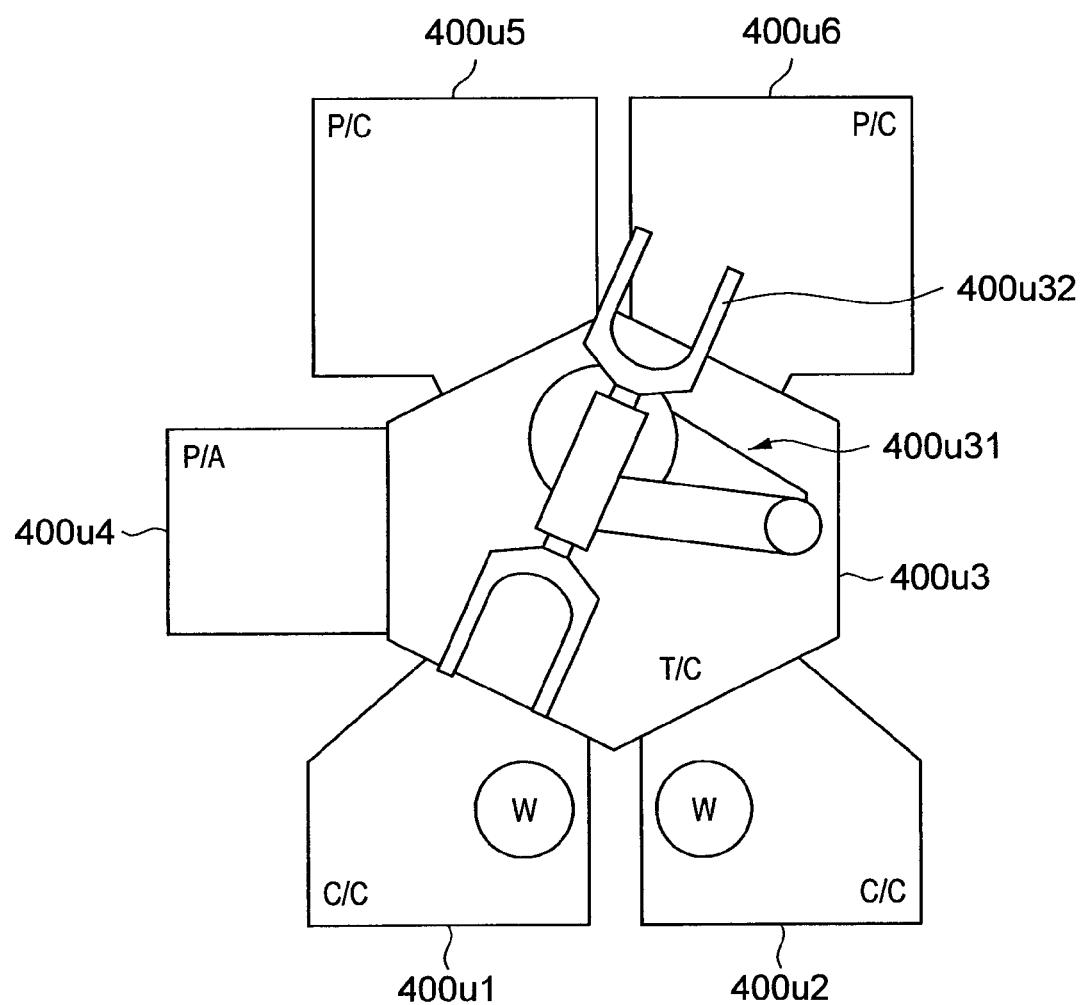
FIG. 16 is another layout drawing of various devices in the plant area Q.

The layout of the various devices in the specified area Q within the plant is also not limited to the layout that is shown in FIG. 2. For example, the layout may be the layout that is shown in FIG. 16. In FIG. 16, cassette chambers (C/Cs) 400$u$1, 400$u$2, transfer chambers (T/C) 400$u$3, a pre-alignment (P/A) 400$u$4, and process chambers (P/Cs (equivalent to the PMs)) 400$u$5, 400$u$6 are disposed within the area Q.

Unprocessed product substrates (wafers W) and processed product substrates are accommodated in the cassette chambers 400$u$1, 400$u$2, and non-product substrates (three, for example) that are used in dummy processes are accommodated at the lowest level of a cassette. The pre-alignment 400$u$4 performs positioning of the wafer W.

A bendable, extendable, and rotatable multiple-jointed arm 400$u$31 is provided in the transfer chamber 400$u$3. The arm 400$u$31 holds the wafer W on a fork 400$u$32 that is provided at an end of the arm 400$u$31. While bending, extending, and rotating as necessary, the arm 400$u$31 transfers the wafer W among the cassette chambers 400$u$1, 400$u$2, the pre-alignment 400$u$4, and the process chambers 400$u$5, 400$u$6.

The feedback control and the feed forward control that include the feedback value adjustment process are performed based on measurement information from an IMM (not shown), in a case where each device in the layout described above is controlled.

Example 2 of change in the layout of the various devices in the area Q

Figure 17:
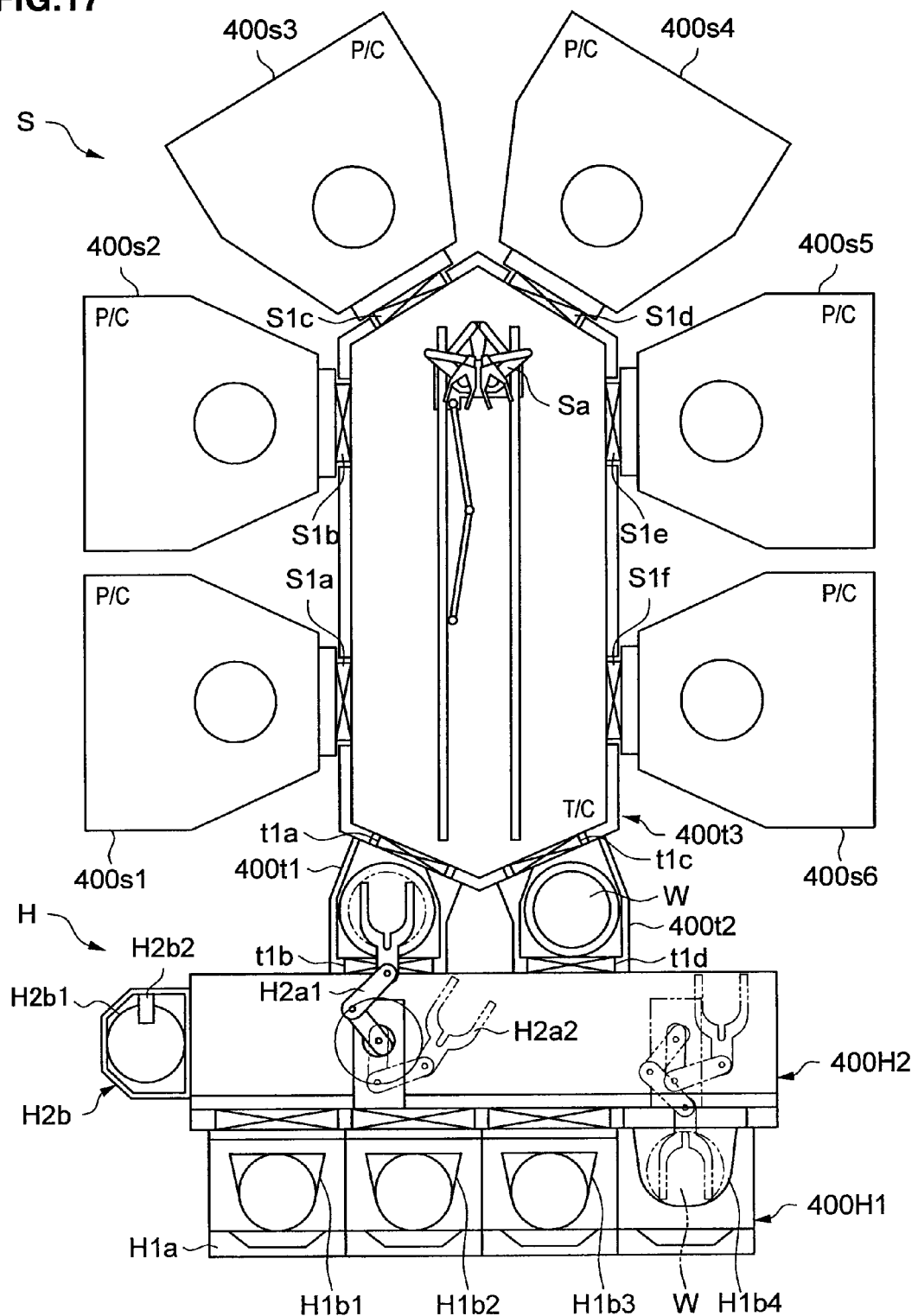
FIG. 17 is another layout drawing of various devices in the plant area Q.

The layout of the various devices in the specified area Q within the plant may also be the layout that is shown in FIG. 17. A transfer system H and a processing system S are disposed in the specified area Q. The transfer system H that transfers the wafer W, and the processing system S performs the substrate processing on the wafer W, such as a deposition process, the etching process, or the like. The transfer system H and the processing system S are linked through load lock modules (LLMs) 400$t$1, 400$t$2.

The transfer system H includes a cassette stage 400H1 and a transfer stage 400H2. A container carrier platform H1$a$ is provided in the cassette stage 400H1, and four cassette containers H1$b$1 to H1$b$4 are placed on the container carrier platform H1$a$. Each of the cassette containers H1$b$ can accommodate, on a plurality of levels, unprocessed product substrates (wafers W), processed product substrates, and non-product substrates that are used for dummy processes.

On the transfer stage 400H2, two bendable, extendable, and rotatable transfer arms H2$a$1, H2$a$2 are supported such that they move in a sliding motion under magnetic drive. The wafers W are held by forks that are mounted on the ends of the arms H2$a$1, H2$a$2.

At one end of the transfer stage 400H2, an alignment mechanism H2$b$ is provided that performs positioning of the wafer W. The alignment mechanism H2$b$ positions the wafer W by rotating a rotating platform H2$b$1 on which the wafer W is placed and using an optical sensor H2$b$2 to detect the state of the outer edge of the wafer W.

A carrier platform that carries the wafer W is provided inside each of the load lock modules 400$t$1, 400$t$2. Gate valves t1$a$, t1$b$, t1$c$, t1$d$ are provided at both ends of the load lock modules 400$t$1, 400$t$2 and can open and close in an airtight manner. According to this configuration, the transfer system H transfers the wafer W among the cassette containers H1$b$1 to H1$b$4, the load lock modules 400$t$1, 400$t$2, and the alignment mechanism H2$b$.

The processing system S is provided with a transfer chamber (T/C) 400$t$3 and six process chambers (P/Cs) 400$s$1 to 400$s$6 (equivalent to the PM 1 to the PM 6). The transfer chamber 400$t$3 is connected to the process chambers 400$s$1 to 400$s$6 through gate valves s1$a$ to s1$f$, respectively, which can open and close in an airtight manner. A bendable, extendable, and rotatable arm Sa is provided in the transfer chamber 400$t$3.

According to this configuration, the processing system uses the arm Sa to transfer the wafer W from the load lock modules 400$t$1, 400$t$2, through the transfer chamber 400$t$3, and to the process chambers 400$s$1 to 400$s$6. The processing system performs a process such as the etching process or the like on the wafer W, then unloads the wafer W through the transfer chamber 400$t$3 to the load lock modules 400$t$1, 400$t$2.

The feedback control and the feed forward control that include the feedback value adjustment process are performed based on measurement information from an IMM (not shown), in a case where each device in the layout described above is controlled.

Figure 18:
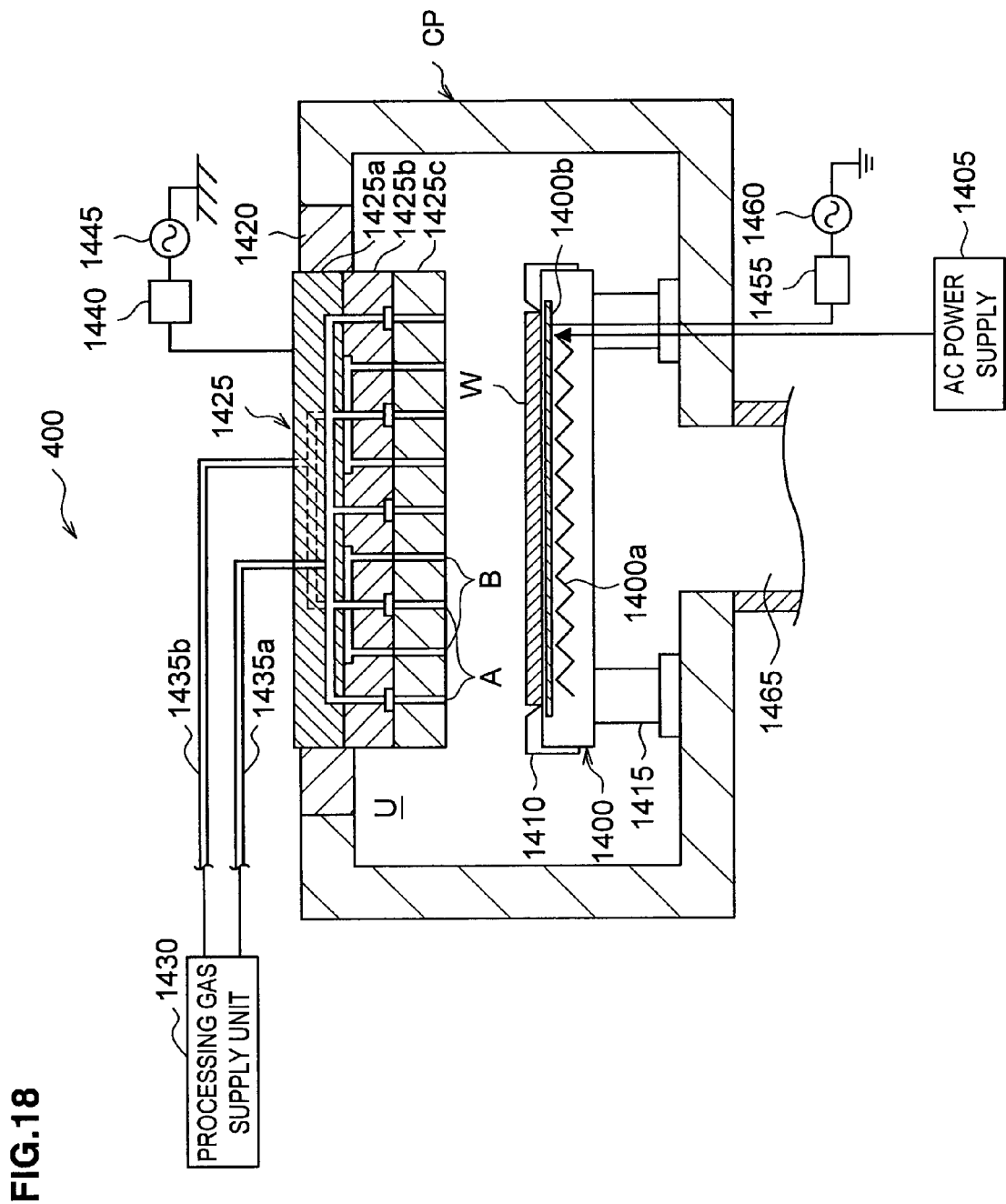
FIG. 18 is a figure that schematically shows a vertical cross section of another interior structure of the process module (PM)

Example of change in the internal structure of the PMs As an example of a change in the internal structure of the PMs, the PMs 400 may be structured as shown by the vertical cross section in FIG. 18, for example.

The PM 400 in FIG. 18 has a substantially cylindrical processing container CP that has an airtight structure. A susceptor 1400, on which the wafer W is placed, is provided in the interior of the processing container CP. A processing chamber U that processes the wafer W is formed inside the processing container CP. A stage heater 1400$a$ and a lower electrode 1400$b$ are embedded in the interior of the susceptor 1400. An alternating current power supply 1405 that is provided outside the processing container CP is connected to the susceptor 1400. The wafer W is held at a specified temperature by an alternating current voltage that is output by the alternating current power supply 1405. A guide ring 1410 that guides the wafer W and focuses a plasma is provided on the outer edge of the susceptor 1400. The susceptor 1400 is supported by a circular tube-shaped supporting member 1415.

A shower head 1425 is mounted on a top portion of the processing container CP through an insulating material 1420. The shower head 1425 is made up of an upper-level block 1425$a$, a mid-level block 1425$b$, and a lower-level block 1425$c$. Two gas channel systems that are formed in each of the blocks 1425$a$, 1425$b$, 1425$c$ are respectively connected to gas injection holes A and gas injection holes B that are formed in alternation in the lower-level block 1425c.

A processing gas supply unit 1430 supplies various types of gases selectively to the interior of the processing container CP. Specifically, the processing gas supply unit 1430 selectively supplies a specified gas to the interior of the processing container CP from the injection holes A through a gas line 1435a. The processing gas supply portion 1430 also selectively supplies a specified gas to the interior of the processing container CP from the injection holes B through a gas line 1435b.

A high-frequency power supply 1445 is connected to the shower head 1425 through a matching box 1440. On the other side of the processing container CP, a high-frequency power supply 1460 is connected through a matching box 1455 to the lower electrode 1400b that is provided in the interior of the susceptor 1400 as an opposing electrode to the shower head 1425. A specified bias voltage is applied to the lower electrode 1400b by the high-frequency electric power that is output from the high-frequency power supply 1460. A specified degree of vacuum is maintained inside the processing container CP by an exhaust mechanism (not shown) that is continuous with an exhaust pipe 1465.

According to this configuration, the gas that is introduced into the processing container CP through the shower head 1425 from the processing gas supply portion 1430 is exited to generate plasma by the high-frequency electric power that is supplied to the shower head 1425 from the high-frequency power supply 1445 and The plasma causes a desired film to form on the wafer W.

According to the layouts of the various devices in the examples 1 and 2 described above, and according to the internal structure of the PMs 400 in the example described above, it is possible to perform the etching process of the wafer W well even after process change is performed inside the same PM 400 because a target value that reflects changes in the atmosphere of the given PM 400 continues to be used.

In the above embodiments, the operations of the units are related to each other. The operations may thus be replaced with a series of operations in consideration of the relations. The control device for the substrate processing apparatus may also be replaced with the control method for the substrate processing apparatus, thus providing program embodiments. The program may be stored in a computer-readable storage medium, thus changing the program embodiment to a computer-readable storage medium embodiment recording the program.

The preferred embodiment of the present invention has been described with reference to the appended drawings, but it is clearly apparent that the present invention is not limited by this example. It should be understood by those skilled in the art that various modifications, combinations, sub-combinations and alterations may occur depending on design requirements and other factors insofar as they are within the scope of the appended claims or the equivalents thereof.

For example, the substrate processing apparatus according to the present invention may also be one of a microwave plasma substrate processing apparatus, an inductively coupled plasma substrate processing apparatus, and a capacitively coupled plasma substrate processing apparatus.

In addition, the substrate process apparatus according to the present invention may be, for example, an etching apparatus, a chemical vapor deposition apparatus (CVD), a coater developer, a cleaning apparatus, a chemical mechanical polishing apparatus, a physical vapor deposition apparatus, an aligner, an ion implanter, or the like.

Furthermore, the substrate processing that is performed by the substrate processing apparatus according to the present invention is not limited to the deposition process, but may be substrate processing like a thermal diffusion process, an etching process, an ashing process, a spattering process, and the like.

The substrate processing apparatus according to the present invention may also be embodied by the TL 800 alone and may also be embodied by the TL 800, the EC 200, and the MC 300.

What is claimed is:

1. A controlling device for controlling a substrate processing apparatus that performs a specified process on a substrate, the controlling device comprising:
  a storage unit that stores a plurality of recipes that respectively indicate different processing sequences, and a specified target value that serves as a control value when the specified process is performed on the substrate;
  a communication unit that causes a measuring device to measure measurement information including a pre-processing state and a post-processing state of the substrate that is processed by the substrate processing apparatus in accordance with a processing sequence indicated in a first recipe included among the plurality of recipes stored in the storage unit, and receives the measurement information;
  a computation unit that computes a feedback value that corresponds to a process state of the substrate processed in the current cycle, based on the pre-processing state and the post-processing state measurement information for the substrate processed in the current cycle within the measurement information received by the communication unit;
  an update unit that updates the target value stored in the storage unit using the feedback value computed by the computation unit;
  a recipe adjustment unit that changes the recipe that indicates the processing sequence performed in the substrate processing apparatus from the first recipe to a second recipe, the first recipe and the second recipe being stored in the storage unit; and
  a process execution control unit that controls a processing of a substrate transferred in the substrate processing apparatus with feed forward control while using the target value updated by the update unit, in accordance with the processing sequence indicated in the second recipe,
  wherein the second recipe is different from the first recipe, but uses the target value updated by the update unit,
  wherein the storage unit stores a plurality of feed forward plans that respectively indicate a processing sequence for performing feed forward control, each feed forward plan including the target value,
  wherein the process execution control unit accesses the plurality of feed forward plans stored in the storage unit,
  wherein even if the recipe adjustment unit changes the recipe that indicates the processing sequence performed in the substrate processing apparatus from the first recipe to the second recipe, the same feed forward plan is selected, and
  wherein the process execution control unit continues to use the target value contained in the same feed forward plan that has been selected to perform feed forward control for a substrate transferred in the substrate processing apparatus.

2. The controlling device according to claim 1, wherein the storage unit stores a plurality of target values, and the process execution control unit accesses the plurality of the target values stored in the storage unit.

3. The controlling device according to claim 2, wherein the process execution control unit continues to use the same target value that has been selected to perform feed forward control for a substrate transferred in the substrate processing apparatus.

4. The controlling device according to claim 2, wherein the controlling device controls a plurality of the substrate processing apparatuses,
the storage unit stores respective target values for each substrate processing apparatus as a linked relationship between each one of the target values and the each substrate processing apparatus,
the recipe adjustment unit selects, from among the plurality of target values stored in the storage unit, the stored target value that has a linked relationship with the substrate processing apparatus that the next substrate to be processed is transferred into, and
the process execution control unit controls the processing of the substrate transferred into the substrate processing apparatus with feed forward control based on the selected target value.

5. The controlling device according to claim 1, wherein the process execution control unit optimizes the target value in accordance with the processing sequence indicated in the second recipe, and uses the updated target value to perform feed forward control for a substrate transferred in the substrate processing apparatus in accordance with the processing sequence indicated in the second recipe.

6. The controlling device according to claim 1, wherein the received measurement information is information for computing at least one of a substrate critical dimension, an etching rate, and a deposition rate.

7. The controlling device according to claim 1, wherein the target value is a parameter that indicates a process condition.

8. The controlling device according to claim 7, wherein the parameter that indicates the process condition is at least one of a substrate processing time, a pressure, a power, a temperature of a specified position in the substrate processing apparatus, a mixture ratio of a plurality of types of gases, and a gas flow volume.

9. The controlling device according to claim 1, wherein the specified process is an etching process.

10. The controlling device according to claim 1, wherein both the first and second recipes are etch recipes.

11. The controlling device according to claim 10, wherein the target value is an etching rate.

12. The controlling device according to claim 1, wherein the updated target value is stored separately from the first and second recipes.

13. The controlling device according to claim 1, wherein the feed forward plan is a numerical relation that is a function of the updated target value.

14. The controlling device according to claim 13, wherein the feed forward plan provides an etch time based on the updated target value.

15. A control method for controlling a substrate processing apparatus that performs a specified process on a substrate, the control method comprising:
storing in a storage unit a plurality of recipes that respectively indicate different processing sequences, and a specified target value that serves as a control value when the specified process is performed on the substrate;
causing a measuring device to measure measurement information including a pre-processing state and a post-processing state of the substrate that is processed by the substrate processing apparatus in accordance with a processing sequence indicated in a first recipe included among the plurality of recipes stored in the storage unit;
receiving the measured measurement information;
computing a feedback value that corresponds to a processed state of the substrate processed in the current cycle, based on pre-processing state and post-processing state measurement information for the substrate processed in a current cycle within the received measurement information;
updating, via an update unit, the target value stored in the storage unit using the computed feedback value;
changing a recipe that indicates the processing sequence performed in the substrate processing apparatus from the first recipe to the second recipe, the first recipe and a second recipe is stored in the storage unit; and
controlling a processing of a substrate transferred in the substrate processing apparatus with feed forward control while using the updated target value, in accordance with the processing sequence indicated in the second recipe,
wherein the second recipe is different from the first recipe, but uses the target value updated by the update unit,
wherein the storage unit stores a plurality of feed forward plans that respectively indicate a processing sequence for performing feed forward control, each feed forward plan including the target value,
wherein a process execution control unit accesses the plurality of feed forward plans stored in the storage unit,
wherein even if the recipe that indicates the processing sequence performed in the substrate processing apparatus is changed from the first recipe to the second recipe, the same feed forward plan is selected, and
wherein the process execution control unit continues to use the target value contained in the same feed forward plan that has been selected to perform feed forward control for a substrate transferred in the substrate processing apparatus.

16. The method of claim 15, wherein both the first and second recipes are etch recipes.

17. The method of claim 16, wherein the target value is an etching rate.

18. The method according to claim 15, wherein the target value is stored separately from the first and second recipes.

19. The method according to claim 15, wherein the feed forward plan is a numerical relation that is a function of the updated target value.

20. The method according to claim 19, wherein the feed forward plan provides an etch time based on the updated target value.

21. A storage medium that stores a control program for a substrate processing apparatus that performs a specified process on a substrate, to control the substrate processing apparatus by executing the control program with a computer, the control program comprising:
a module that stores in a storage unit a plurality of recipes that respectively indicate different processing sequences, and a specified target value that serves as a control value when the specified process is performed on the substrate;
a module that causes a measuring device to measure measurement information including a pre-processing state and a post-processing state of the substrate that is processed by the substrate processing apparatus in accordance with a processing sequence indicated in a first recipe included among the plurality of recipes stored in the storage unit;

a module that receives the measurement information;

a module that computes a feedback value that corresponds to a processed state of the substrate processed in the current cycle, based on the pre-processing state and the post-processing state measurement information for the substrate processed in the current cycle within the received measurement information;

a module that updates, via an update unit, the target value stored in the storage unit using the computed feedback value;

a module that changes a recipe that indicates the processing sequence performed in the substrate processing apparatus from the first recipe to the second recipe, the first recipe and a second recipe is stored in the storage unit; and a module that controls a processing of a substrate transferred in the substrate processing apparatus with feed forward control while using the updated target value, in accordance with the processing sequence indicated in the second recipe, wherein the second recipe is different from the first recipe, but uses the target value updated by the update unit, wherein the storage unit stores a plurality of feed forward plans that respectively indicate a processing sequence for performing feed forward control, each feed forward plan including the target value, wherein the module that controls processing of a substrate accesses the plurality of feed forward plans stored in the storage unit, wherein even if the module that changes a recipe changes the recipe that indicates the processing sequence performed in the substrate processing apparatus from the first recipe to the second recipe, the same feed forward plan is selected, and wherein the module that controls processing of a substrate continues to use the target value contained in the same feed forward plan that has been selected to perform feed forward control for a substrate transferred in the substrate processing apparatus.

22. The storage device of claim 21, wherein both the first and second recipes are etch recipes.

23. The storage device of claim 22, wherein the target value is an etching rate.

24. The storage medium according to claim 21, wherein the updated target value is stored separately from the first and second recipes.

25. The storage medium according to claim 21, wherein the feed forward plan is a numerical relation that is a function of the updated target value.

26. The storage medium according to claim 25, wherein the feed forward plan provides an etch time based on the updated threshold value.

* * * * *